(12) United States Patent
Kim et al.

(10) Patent No.: US 12,500,171 B2
(45) Date of Patent: Dec. 16, 2025

(54) NON-VOLATILE MEMORY DEVICES WITH DUMMY CHANNEL STRUCTURES IN CONTACT REGION AND ASSOCIATED SYSTEMS

(71) Applicant: Samsung Electronics Co., Ltd., Suwon-si (KR)

(72) Inventors: Junhyoung Kim, Seoul (KR); Kangmin Kim, Hwaseong-si (KR); Taemin Eom, Hwaseong-si (KR); Seungmin Lee, Seoul (KR); Changsun Hwang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 814 days.

(21) Appl. No.: 17/563,275

(22) Filed: Dec. 28, 2021

(65) Prior Publication Data

US 2022/0375862 A1 Nov. 24, 2022

(30) Foreign Application Priority Data

May 18, 2021 (KR) .................. 10-2021-0064208

(51) Int. Cl.
*H01L 23/535* (2006.01)
*H01L 27/11556* (2017.01)
(Continued)

(52) U.S. Cl.
CPC ........... *H01L 23/535* (2013.01); *H10B 41/27* (2023.02); *H10B 43/27* (2023.02)

(58) Field of Classification Search
CPC .................................................. H01L 23/535
See application file for complete search history.

(56) References Cited

U.S. PATENT DOCUMENTS

| 10,861,872 | B2  | 12/2020 | Hua et al. |
| 2019/0148349 | A1* | 5/2019 | Kim .......... H01L 25/18 257/738 |

(Continued)

FOREIGN PATENT DOCUMENTS

| CN | 210535667 U | * 5/2020 | ............. H10B 41/10 |
| KR | 10-2020-0080464 A | 7/2020 | |
| KR | 10-2021-0052928 A | 5/2021 | |

OTHER PUBLICATIONS

Nojiri et al. "Evaluation and Reduction of Electron Shading Damage in High Temperature Etching" 1999 4th International Symposium on Plasma Process-Induced Damage, pp. 29-32 (1999).

(Continued)

*Primary Examiner* — Peter Bradford
(74) *Attorney, Agent, or Firm* — Wolf, Greenfield & Sacks, P.C.

(57) ABSTRACT

A semiconductor device includes a substrate including a cell array region and a contact region; a plurality of gate electrodes arranged on the substrate in a first direction perpendicular to an upper surface of the substrate, the plurality of gate electrodes being extending in the cell array region and the contact region; a plurality of channel structures penetrating the plurality of gate electrodes in the first direction in the cell array region; a plurality of dummy channel structures penetrating the plurality of gate electrodes in the first direction in the contact region; a plurality of cell gate contacts extending in the first direction and each electrically connected to a respective one of the plurality of gate electrodes in the contact region; and a plurality of dummy contacts extending in the first direction on the plurality of dummy channel structures.

17 Claims, 31 Drawing Sheets

(51) Int. Cl.
*H01L 27/11582* (2017.01)
*H10B 41/27* (2023.01)
*H10B 43/27* (2023.01)

(56) References Cited

U.S. PATENT DOCUMENTS

| | | | |
|---|---|---|---|
| 2019/0267333 A1* | 8/2019 | Hong | H10B 43/27 |
| 2019/0304993 A1* | 10/2019 | Lee | H10B 43/27 |
| 2020/0058667 A1* | 2/2020 | Baek | H10B 41/27 |
| 2020/0119031 A1* | 4/2020 | Shen | H10B 41/35 |
| 2020/0203367 A1* | 6/2020 | Cheon | H10B 43/50 |
| 2020/0212061 A1* | 7/2020 | Choi | H01L 23/5226 |
| 2020/0395310 A1 | 12/2020 | Mukae et al. | |
| 2020/0402906 A1 | 12/2020 | Lim | |
| 2020/0411540 A1 | 12/2020 | Cheon et al. | |
| 2020/0411546 A1 | 12/2020 | Son et al. | |
| 2021/0005620 A1 | 1/2021 | Kim et al. | |
| 2021/0005627 A1 | 1/2021 | Hinoue et al. | |
| 2021/0020647 A1 | 1/2021 | Kim et al. | |
| 2022/0130791 A1* | 4/2022 | Lee | H01L 24/80 |
| 2022/0148961 A1* | 5/2022 | Lee | H01L 23/528 |

OTHER PUBLICATIONS

Nojiri et al. "Reduction of Electron Shading Damage During High Temperature Etching Using Time Modulation Bias Method" 1999 Dry Process Symposium, pp. 93-98 (1999).

\* cited by examiner

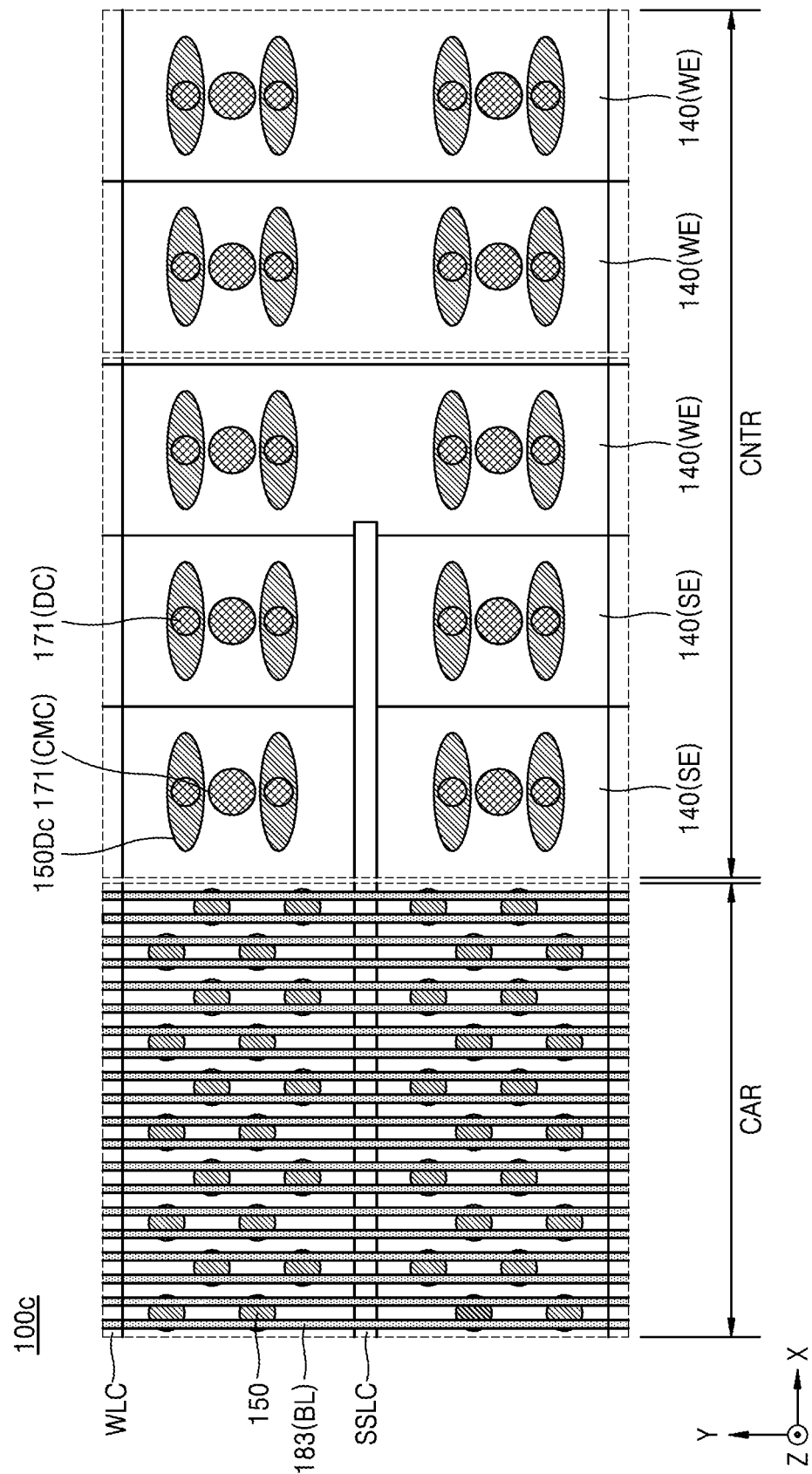

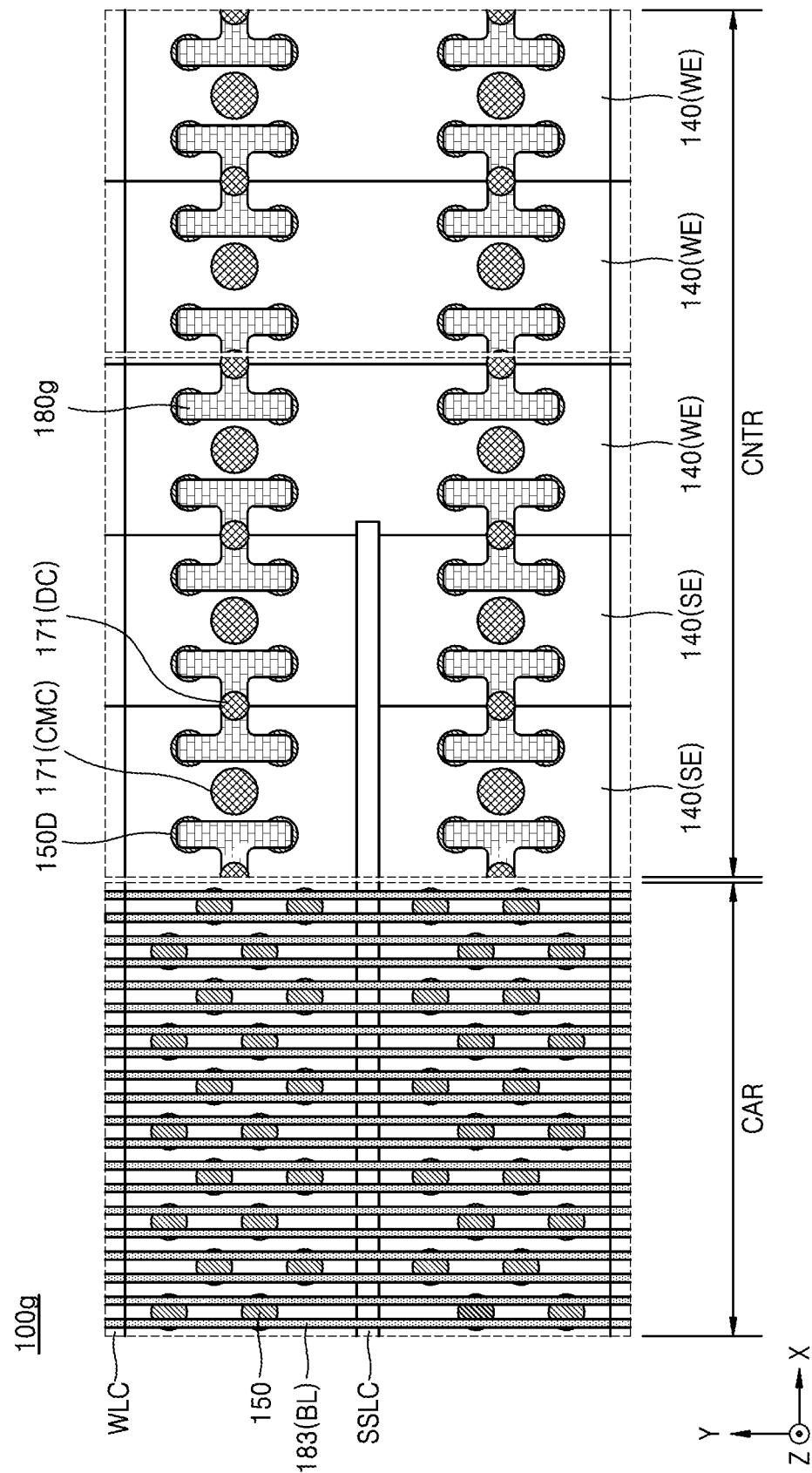

NON-VOLATILE MEMORY DEVICES WITH DUMMY CHANNEL STRUCTURES IN CONTACT REGION AND ASSOCIATED SYSTEMS

CROSS-REFERENCE TO RELATED APPLICATION

This application is based on and claims priority under 35 U.S.C. § 119 to Korean Patent Application No. 10-2021-0064208, filed on May 18, 2021, in the Korean Intellectual Property Office, the disclosure of which is incorporated by reference herein in its entirety.

BACKGROUND

The present disclosure relates to semiconductor memory devices. Recently, according to the multi-functionalization of information and communication devices, demand has increased for the large capacity and high integration of memory devices. According to a reduction in the size of a memory cell for high integration, operation circuits and/or wiring structures included in memory devices for operation and electrical connection of the memory devices may also be more complex. Accordingly, there is demand for a memory device having excellent electrical characteristics while improving the degree of integration of the memory device.

SUMMARY

The inventive concept provides a semiconductor device with an improved reliability and a memory system including the same.

According to an aspect of the inventive concept, there is provided a semiconductor device. The semiconductor device includes a substrate including a cell array region and a contact region; a plurality of gate electrodes arranged on the substrate in a first direction perpendicular to an upper surface of the substrate, the plurality of gate electrodes extending in the cell array region and the contact region; a plurality of channel structures penetrating the plurality of gate electrodes in the first direction in the cell array region; a plurality of dummy channel structures penetrating the plurality of gate electrodes in the first direction in the contact region; a plurality of cell gate contacts extending in the first direction and each electrically connected to a respective one of the plurality of gate electrodes in the contact region; and a plurality of dummy contacts extending in the first direction on the plurality of dummy channel structures.

According to another aspect of the inventive concept, there is provided a semiconductor device. The semiconductor device includes a plurality of gate electrodes stacked on a substrate in a first direction perpendicular to the substrate, wherein each of the plurality of gate electrodes constitutes a stairstep structure in which a first of the plurality of gate electrodes protrudes more in a second direction perpendicular to the first direction than a second of the plurality of gate electrodes that is farther away from the substrate; a plurality of dummy channel structures penetrating the stairstep structure in the first direction; a plurality of cell gate contacts extending in the first direction on the stairstep structure and each electrically connected to a respective one of the plurality of gate electrodes; and a plurality of dummy contacts each extending in the first direction and electrically connected to a respective one of the plurality of dummy channel structures.

According to another aspect of the inventive concept, there is provided an electronic system. The electronic system includes a main substrate; a semiconductor device on the main substrate; and a controller electrically connected to the semiconductor device on the main substrate, wherein the semiconductor device includes a substrate including a cell array region and a contact region; a plurality of gate electrodes arranged on the substrate in a first direction perpendicular to an upper surface of the substrate, the plurality of gate electrodes extending in the cell array region and the contact region; a plurality of channel structures penetrating the plurality of gate electrodes in the first direction in the cell array region; a plurality of dummy channel structures penetrating the plurality of gate electrodes in the first direction in the contact region; a plurality of cell gate contacts extending in the first direction and each electrically connected to a respective one of the plurality of gate electrodes in the contact region; and a plurality of dummy contacts extending in the first direction on the plurality of dummy channel structures.

According to another aspect of the inventive concept, there is provided a method of manufacturing a semiconductor device. The method includes alternately forming a plurality of insulating layers and a plurality of sacrificial layers on a substrate; forming a plurality of channel structures and a plurality of dummy channel structures penetrating the plurality of insulating layers and the plurality of sacrificial layers in a first direction perpendicular to an upper surface of the substrate; removing the plurality of sacrificial layers and providing a plurality of gate electrodes in a space from which the plurality of sacrificial layers are removed; and forming a plurality of dummy contacts contacting the plurality of dummy channel structures and extending in the first direction.

BRIEF DESCRIPTION OF THE DRAWINGS

Embodiments of the inventive concept will be more clearly understood from the following detailed description taken in conjunction with the accompanying drawings in which:

FIGS. 7A to 7G are plan views illustrating semiconductor devices according to other embodiments;

DETAILED DESCRIPTION

Figure 1:
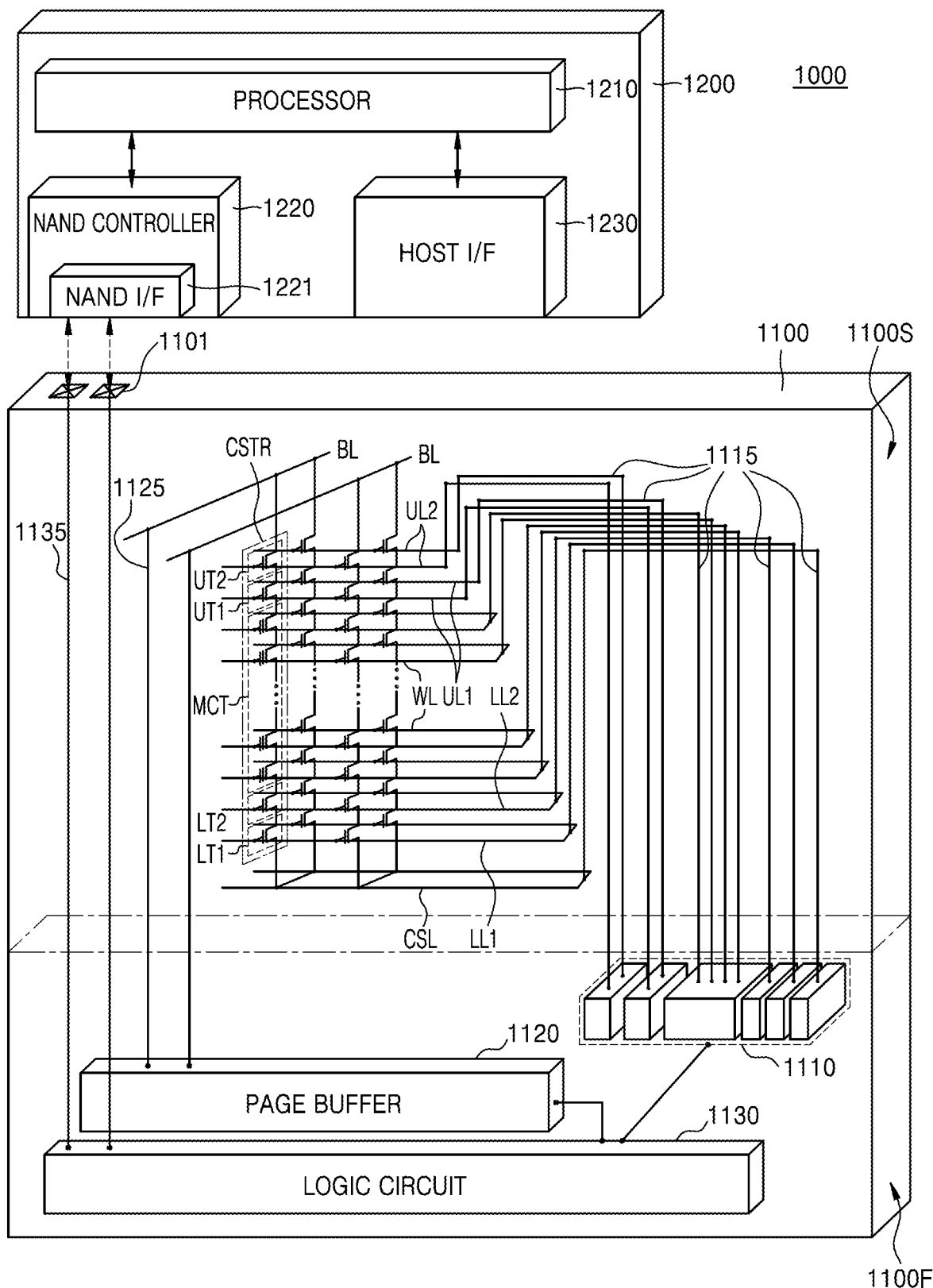
FIG. 1 is a diagram schematically illustrating an electronic system including a semiconductor device according to an embodiment of the inventive concept.

Hereinafter, embodiments of the inventive concept will be described in detail with reference to the accompanying drawings. The same reference numerals are used for the same components in the drawings, and redundant descriptions thereof may be omitted.

FIG. 1 is a diagram schematically illustrating an electronic system 1000 including a semiconductor device 1100 according to an embodiment of the inventive concept.

Referring to FIG. 1, the electronic system 1000 according to an embodiment of the inventive concept may include the semiconductor device 1100 and a controller 1200 electrically connected to the semiconductor device 1100. The electronic system 1000 may be a storage device including one or a plurality of semiconductor devices 1100 or an electronic device including the storage device. For example, the electronic system 1000 may be a solid state drive (SSD) device including at least one semiconductor device 1100, a universal serial bus (USB), a computing system, a medical device, or a communication device.

The semiconductor device 1100 may be a nonvolatile memory device. For example, the semiconductor device 1100 may be a NAND flash memory device including semiconductor devices 100, 100a, 100b, 100c, 100d, 100e, 100f, and 100g to be described later with reference to FIGS. 4 to 10. The semiconductor device 1100 may include a first structure 1100F and a second structure 1100S on the first structure 1100F. In some embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a plurality of bit lines BL, a common source line CSL, a plurality of word lines WL, first and second gate upper lines UL1 and UL2, first and second gate lower lines LL1 and LL2, and a plurality of memory cell strings CSTR between the plurality of bit lines BL and the common source line CSL.

In the second structure 1100S, each of the plurality of memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistor UT1 and UT2. The number of the lower transistors LT1 and LT2 and the number of upper transistors UT1 and UT2 may be variously modified according to embodiments.

In some embodiments, the upper transistors UT1 and UT2 may be string selection transistors, and the lower transistors LT1 and LT2 may be ground selection transistors. The plurality of gate lower lines LL1 and LL2 may be connected to gate electrodes of the lower transistors LT1 and LT2, respectively. The plurality of word lines WL may be connected to gate electrodes of the plurality of memory cell transistors MCT, and the gate upper lines UL1 and UL2 may be connected to gate electrodes of the upper transistors UT1 and UT2.

The common source line CSL, the plurality of gate lower lines LL1 and LL2, the plurality of word lines WL, and the plurality of gate upper lines UL1 and UL2 may be electrically connected to the decoder circuit 1110 through a plurality of first connection wirings 1115 extending to the second structure 1100S in the first structure 1100F. The plurality of bit lines BL may be electrically connected to the page buffer 1120 through a plurality of second connection wirings 1125 extending to the second structure 1100S in the first structure 1100F.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 extending to the second structure 1100S in the first structure 1100F.

The controller 1200 may include a processor 1210, a NAND controller 1220, and a host interface (I/F) 1230. According to embodiments, the electronic system 1000 may include a plurality of semiconductor devices 1100, and in this case, the controller 1200 may control the plurality of semiconductor devices 1100.

The processor 1210 may control an overall operation of the electronic system 1000 including the controller 1200. The processor 1210 may operate according to certain firmware, and may access the semiconductor device 1100 by controlling the NAND controller 1220. The NAND controller 1220 may include a NAND interface 1221 that performs communication with the semiconductor device 1100. A control command for controlling the semiconductor device 1100, data to be written to the plurality of memory cell transistors MCT of the semiconductor device 1100, data to be read from the plurality of memory cell transistors MCT of the semiconductor device 1100, etc. may be transmitted through the NAND interface 1221. The host interface 1230 may provide a communication function between the electronic system 1000 and an external host. When receiving the control command from the external host through the host interface 1230, the processor 1210 may control the semiconductor device 1100 in response to the control command.

Figure 2:
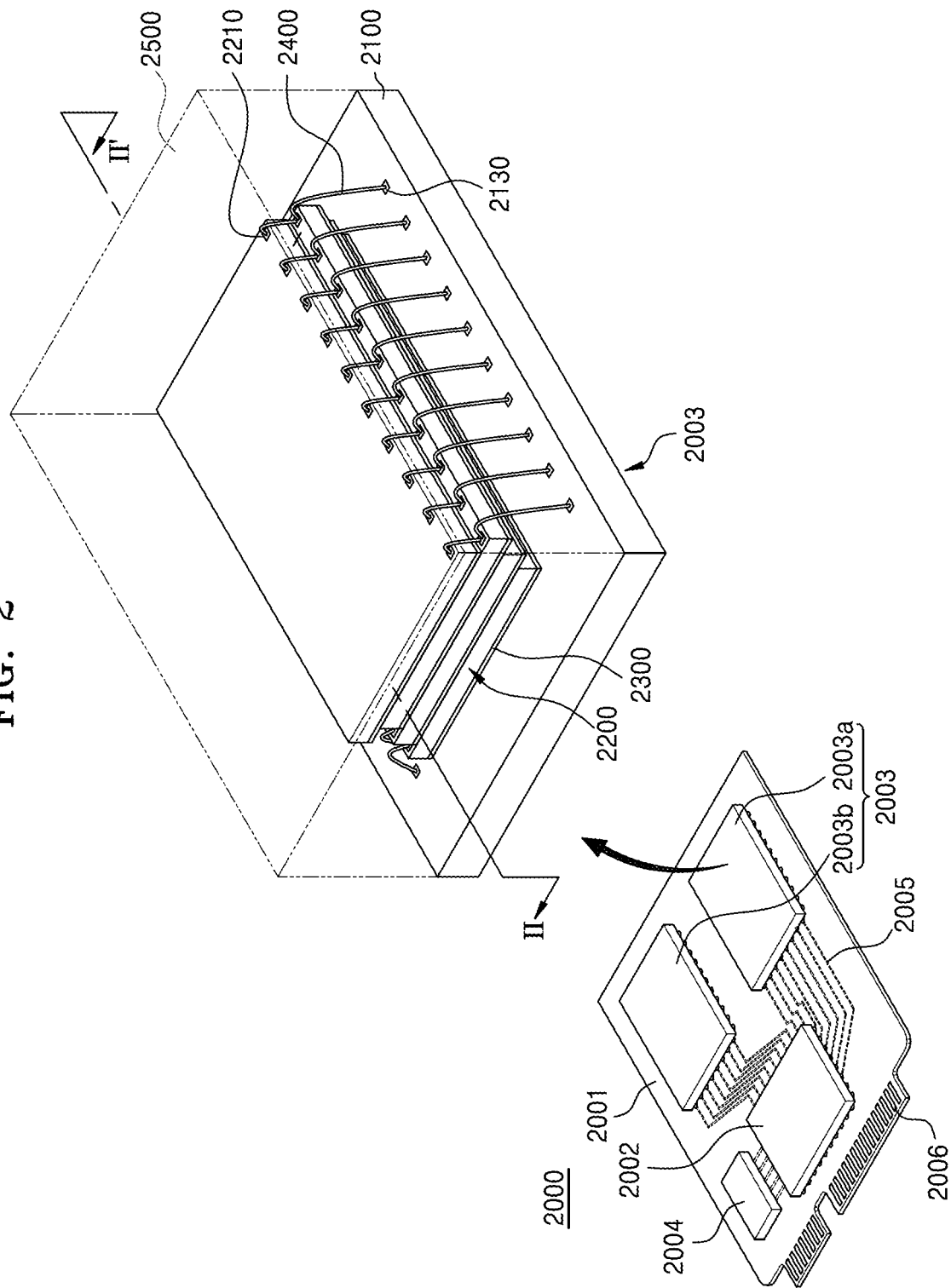
FIG. 2 is a perspective view schematically illustrating an electronic system including a semiconductor device according to an embodiment of the inventive concept.

FIG. 2 is a perspective view schematically illustrating an electronic system 2000 including a semiconductor device according to an embodiment of the inventive concept.

Referring to FIG. 2, the electronic system 2000 according to an embodiment of the inventive concept may include a main substrate 2001, a controller 2002 mounted on the main substrate 2001, one or more semiconductor packages 2003, and DRAM 2004. The semiconductor package 2003 and the DRAM 2004 may be connected to the controller 2002 by a plurality of wiring patterns 2005 formed on the main substrate 2001.

The main substrate 2001 may include a connector 2006 including a plurality of pins coupled to an external host. The number and arrangement of the plurality of pins in the connector 2006 may vary depending on a communication interface between the electronic system 2000 and the external host. In some embodiments, the electronic system 2000 may communicate with the external host according to any one of interfaces such as a universal serial bus (USB), peripheral component interconnect express (PCI-Express), serial advanced technology attachment (SATA), universal flash storage (UFS) M-Phy, etc. In some embodiments, the electronic system 2000 may operate by power supplied from the external host through the connector 2006. The electronic system 2000 may further include a power management integrated circuit (PMIC) distributing the power supplied from the external host to the controller 2002 and the semiconductor package 2003.

The controller 2002 may write data to or read data from the semiconductor package 2003, and may improve an operating speed of the electronic system 2000.

The DRAM 2004 may be a buffer memory for reducing a speed difference between the semiconductor package 2003 that is a data storage space and the external host. The DRAM 2004 included in the electronic system 2000 may operate as a kind of cache memory, and may provide a space for temporarily storing data in a control operation on the semiconductor package 2003. When the electronic system 2000 includes the DRAM 2004, the controller 2002 may further include a DRAM controller for controlling the DRAM 2004 in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the plurality of semiconductor chips 2200 on the package substrate 2100, an adhesive layer 2300 disposed on a lower surface of each of the plurality of semiconductor chips 2200, a connection structure 2400 electrically connecting the plurality of semiconductor chips 2200 to the package substrate 2100, and a molding layer 2500 covering the plurality of semiconductor chips 2200 and the connection structure 2400 on the package substrate 2100.

The package substrate 2100 may be a printed circuit board including a plurality of package upper pads 2130. Each of the plurality of semiconductor chips 2200 may include an input/output pad 2210. The input/output pad 2210 may correspond to the input/output pad 1101 of FIG. 1. Each of the plurality of semiconductor chips 2200 may include a plurality of gate stacks 3210 and a plurality of channel structures 3220. Each of the plurality of semiconductor chips 2200 may include at least one of the semiconductor devices 100, 100a, 100b, 100c, 100d, 100e, 100f and 100g with reference to FIGS. 4 to 10.

In some embodiments, the connection structure 2400 may be a bonding wire electrically connecting the input/output pad 2210 to the package upper pad 2130. Accordingly, in the first and second semiconductor packages 2003a and 2003b, the plurality of semiconductor chips 2200 may be electrically connected to each other by a bonding wiring method, and may be electrically connected to the package upper pad 2130 of the package substrate 2100. According to embodiments, in the first and second semiconductor packages 2003a and 2003b, the plurality of semiconductor chips 2200 may be electrically connected to each other by a connection structure including a through silicon via (TSV), instead of the connection structure 2400 of a bonding wire method.

In some embodiments, the controller 2002 and the plurality of semiconductor chips 2200 may be included in one package. In an embodiment, the controller 2002 and the plurality of semiconductor chips 2200 are mounted on a separate interposer substrate that is different from the main substrate 2001, and the controller 2002 and the plurality of semiconductor chips 2200 may be connected to each other by a wiring formed on the interposer substrate.

Figure 3:
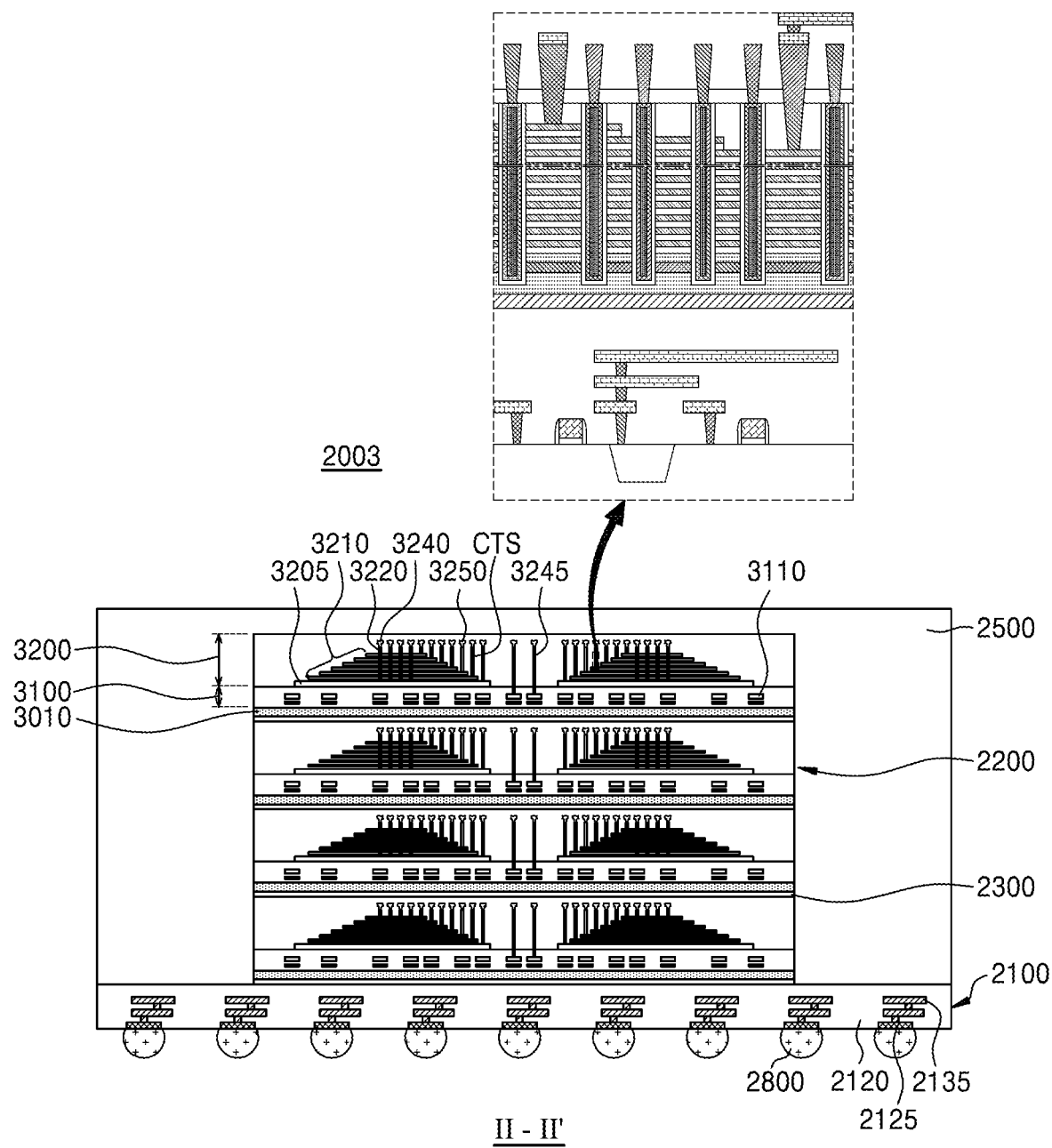
FIG. 3 is a cross-sectional view schematically illustrating semiconductor packages according to an embodiment of the inventive concept.

FIG. 3 is a cross-sectional view schematically illustrating semiconductor packages according to an embodiment of the inventive concept. FIG. 3 shows a configuration in more detail on a cross-sectional view taken along a cutting line II-II' of FIG. 2.

Referring to FIG. 3, in the semiconductor package 2003, the package substrate 2100 may be a printed circuit board. The package substrate 2100 may include a package substrate body 2120, a plurality of package upper pads 2130 (see FIG. 2) disposed on an upper surface of the package substrate body 2120, a plurality of lower pads 2125 disposed on a lower surface of the package substrate body 2120 or exposed through the lower surface thereof, and a plurality of internal wirings 2135 electrically connecting the plurality of upper pads 2130 and the plurality of lower pads 2125 inside the package substrate body 2120. The plurality of upper pads 2130 may be electrically connected to the plurality of connection structures 2400. The plurality of lower pads 2125 may be connected to the plurality of wiring patterns 2005 on the main substrate 2001 of the electronic system 2000 illustrated in FIG. 2 through a plurality of conductive connectors 2800.

Each of the plurality of semiconductor chips 2200 may include a semiconductor substrate 3010 and a first structure 3100 and a second structure 3200 sequentially stacked on the semiconductor substrate 3010. The first structure 3100 may include a peripheral circuit region including a plurality of peripheral wirings 3110. The second structure 3200 may include a common source line 3205, a gate stack 3210 on the common source line 3205, a channel structure 3220 penetrating the gate stack 3210, a bit line 3240 electrically connected to the channel structure 3220, and a gate stack 3210. The gate stack 3210 may include a stairstep structure. The second structure 3200 may further include a plurality of dummy channel structures 150D (see FIG. 6B) penetrating the stairstep structure and a plurality of dummy contacts (DCs) 171 (see FIG. 6B) disposed on the plurality of dummy channel structures 150D (see FIG. 6B). More detailed configurations and various modifications of the plurality of dummy channel structures 150D (see FIG. 6B) and the plurality of DCs 171 (see FIG. 6B) are generally the same as will be described later with reference to FIGS. 5 to 7G.

Each of the plurality of semiconductor chips 2200 may include a through wiring 3245 electrically connected to the plurality of peripheral wirings 3110 of the first structure 3100 and extending into the second structure 3200. The through wiring 3245 may be disposed outside the gate stack 3210. In other embodiments, the semiconductor package 2003 may further include a through wiring penetrating the gate stack 3210. Each of the plurality of semiconductor chips 2200 may further include an input/output pad (2210 of FIG. 2) electrically connected to the plurality of peripheral wirings 3110 of the first structure 3100.

Figure 4:
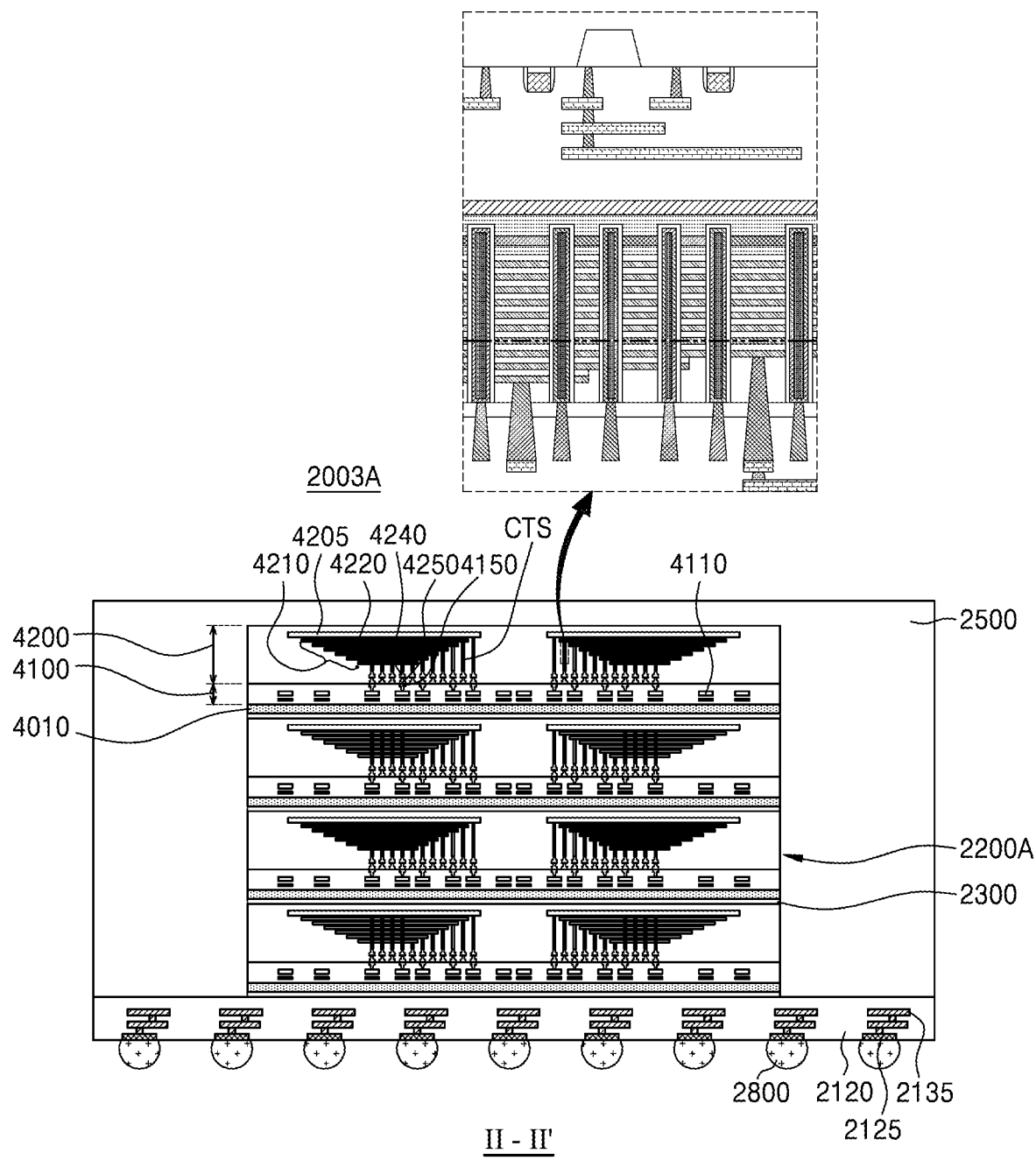
FIG. 4 is a cross-sectional view schematically illustrating a semiconductor package according to an embodiment of the inventive concept.

FIG. 4 is a cross-sectional view schematically illustrating a semiconductor package 2003A according to an embodiment of the inventive concept. FIG. 4 shows a configuration of a part corresponding to a cross-section taken along line II-II' of FIG. 2.

Referring to FIG. 4, the semiconductor package 2003A has substantially the same configuration as the semiconductor package 2003 described with reference to FIG. 3. However, the semiconductor package 2003A includes a plurality of semiconductor chips 2200A. Each of the plurality of semiconductor chips 2200A may include a semiconductor substrate 4010, a first structure 4100 on the semiconductor substrate 4010, and a second structure 4200 bonded to the first structure 4100 by a wafer bonding method on the first structure 4100.

The first structure 4100 may include a peripheral circuit region including a peripheral wiring 4110 and a plurality of first junction structures 4150. The second structure 4200 may include a common source line 4205, a gate stack 4210 between the common source line 4205 and the first structure 4100, and a channel structure 4220 penetrating the gate stack 4210. The gate stack 4210 may include a stairstep structure. The second structure 4200 may further include the plurality of dummy channel structures 150D (see FIG. 6B) penetrating the stairstep structure and the plurality of DCs 171 (see FIG. 6B) disposed on the plurality of dummy channel structures 150D (see FIG. 6B). More detailed configurations and various modifications of the plurality of dummy channel structures 150D (see FIG. 6B) and the plurality of DCs 171 (see FIG. 6B) are generally the same as will be described later with reference to FIGS. 5 to 7G.

Also, each of the plurality of semiconductor chips 2200A may include a plurality of second junction structures 4250 electrically connected to the plurality of word lines WL (see FIG. 1) of the gate stack 4210, respectively. For example, the plurality of second junction structures 4250 may be electrically connected to the plurality of channel structures 4220 and the plurality of word lines WL (see FIG. 1) through a plurality of bit lines 4240 electrically connected to the channel structures 4220 respectively and a contact structure CTS electrically connected to the plurality of word lines WL (see FIG. 1).

The plurality of first junction structures 4150 of the first structure 4100 and the plurality of second junction structures 4250 of the second structure 4200 may be bonded to each other. Bonded parts of the plurality of first junction structures 4150 and the plurality of second junction structures 4250 may include, for example, copper (Cu).

The plurality of semiconductor chips 2200 illustrated in FIG. 3 and the plurality of semiconductor chips 2200A illustrated in FIG. 4 may be electrically connected to each other by a plurality of connection structures 2400 (see FIG. 2) having a bonding wire shape. In other embodiments, the plurality of semiconductor chips 2200 illustrated in FIG. 3 and the plurality of semiconductor chips 2200A illustrated in FIG. 4 may be electrically connected to each other by a connection structure including a TSV.

Figure 5:
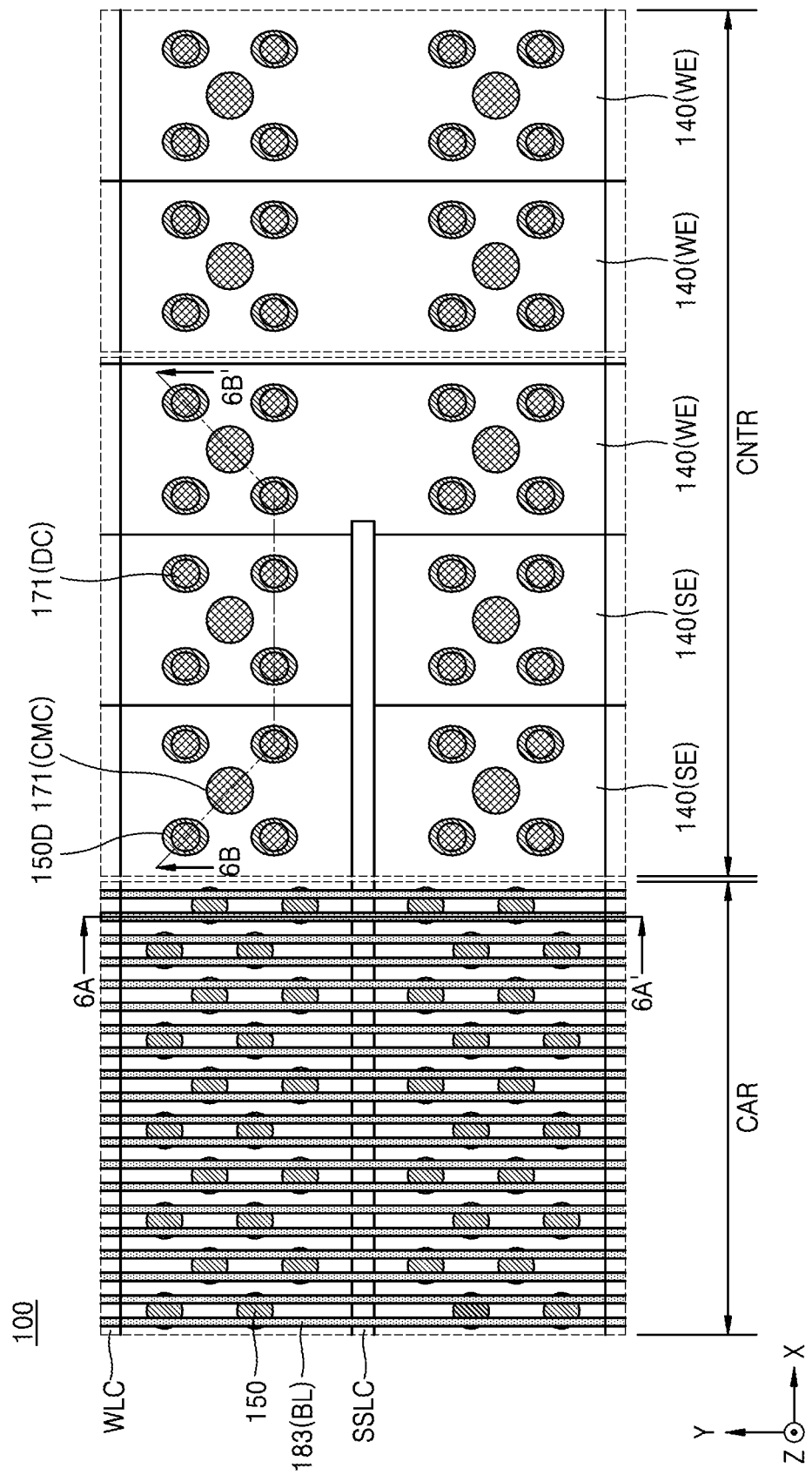
FIG. 5 is a layout diagram illustrating a semiconductor device according to embodiments.

FIG. 5 is a layout diagram illustrating a semiconductor device according to embodiments.

Figure 6A:
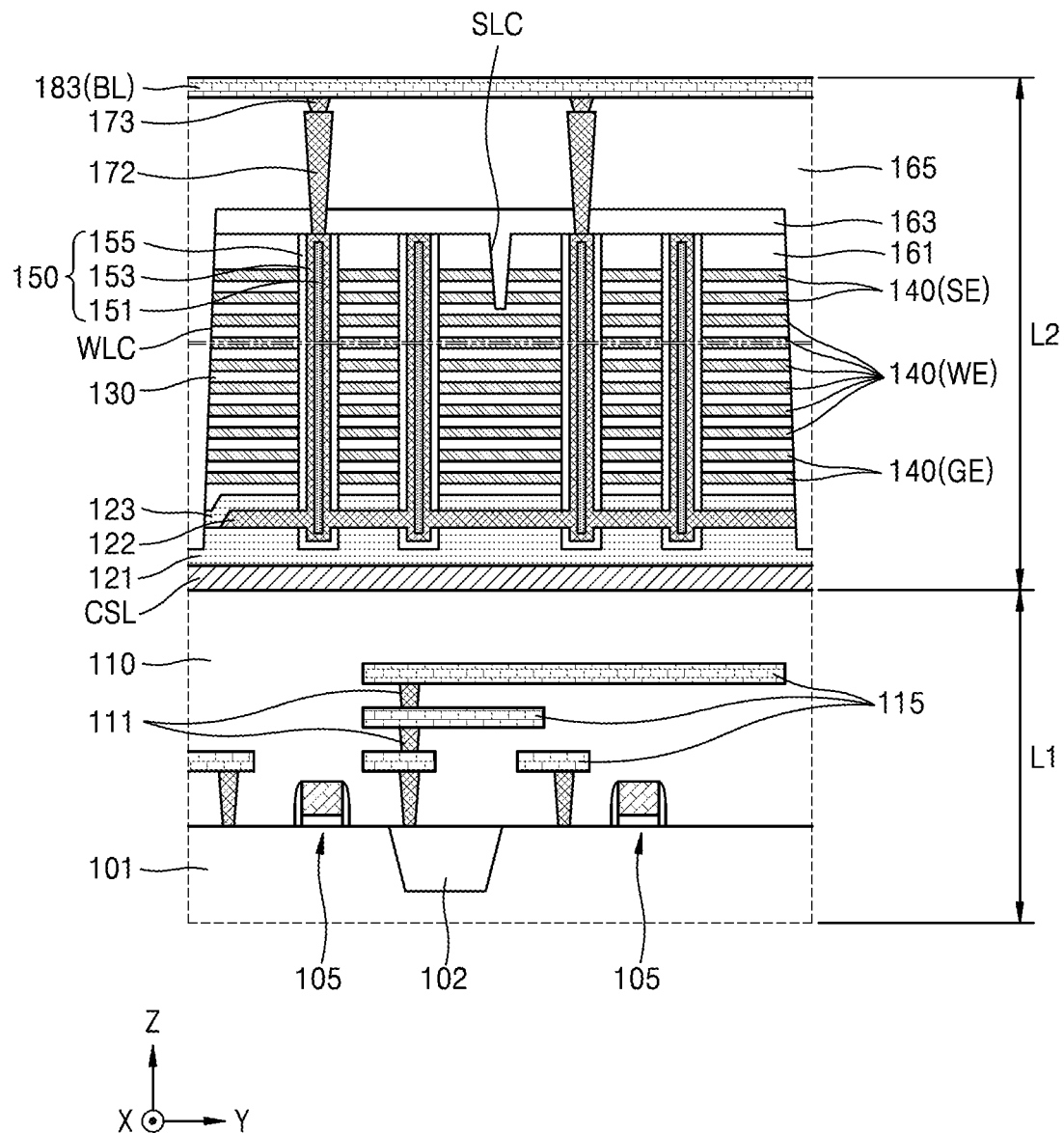
FIG. 6A is a cross-sectional view taken along the cutting line 6A-6A' of FIG. 5.

FIG. 6A is a cross-sectional view taken along the cutting line 6A-6A' of FIG. 5.

Figure 6B:
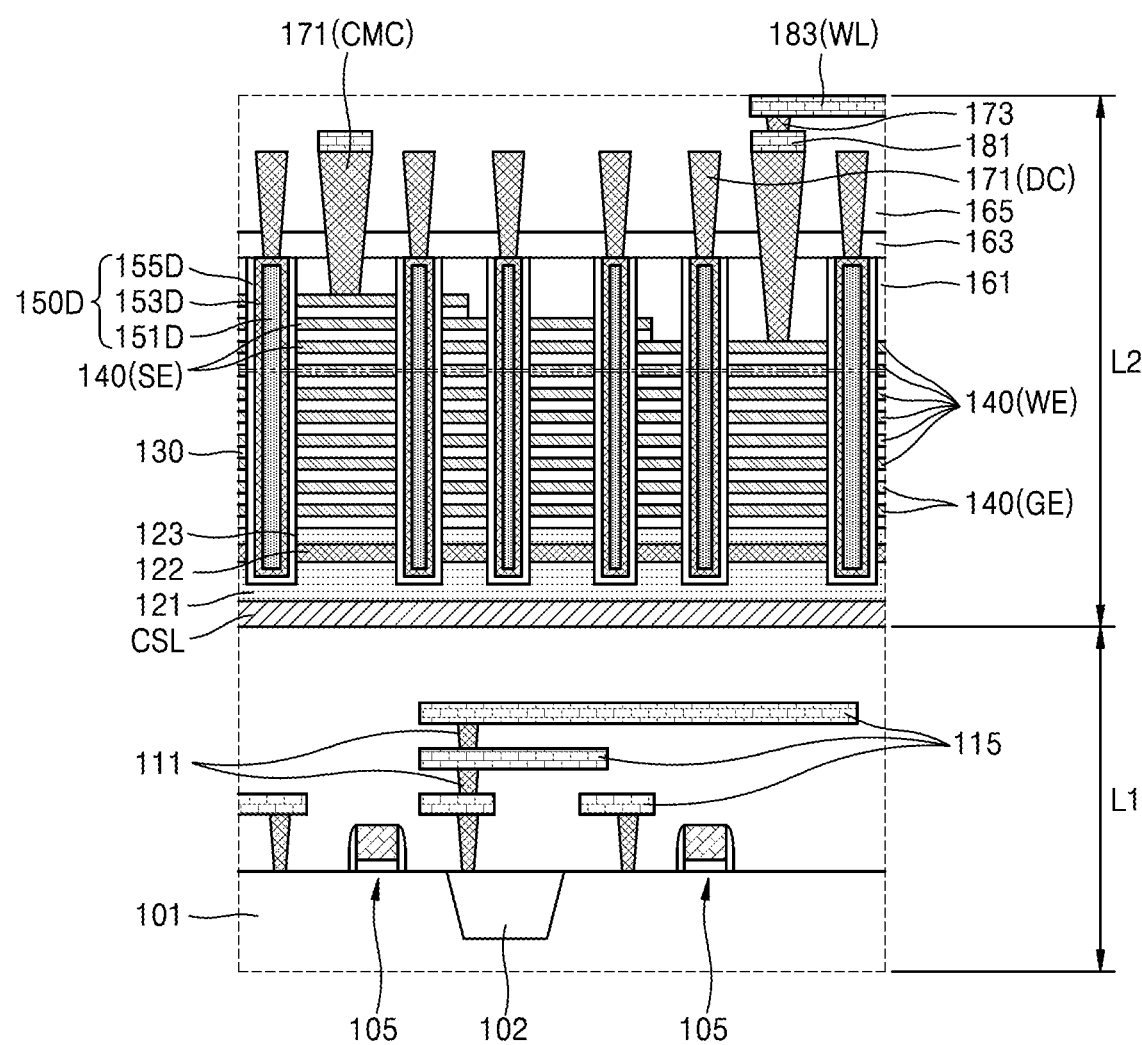
FIG. 6B is a cross-sectional view taken along the cutting line 6B-6B' of FIG. 5.

FIG. 6B is a cross-sectional view taken along the cutting line 6B-6B' of FIG. 5.

Referring to FIGS. 5 to 6B, the semiconductor device 100 may include a first semiconductor device layer L1 including a peripheral circuit and a second semiconductor device layer L2 including a plurality of channel structures 150 respectively operating as the memory cell strings CSTR (see FIG. 1). The second semiconductor device layer L2 may be disposed on the first semiconductor device layer L1. The first semiconductor device layer L1 may correspond to the first structure 1100F of FIG. 1, and the second semiconductor device layer L2 may correspond to the second structure 1100S of FIG. 1.

The first semiconductor device layer L1 may include a substrate 101, peripheral transistors 105 disposed on the substrate 101, a peripheral circuit wiring electrically connected to the peripheral transistors 105, and a lower insulating layer 110 covering the peripheral transistors 105 and the peripheral circuit wiring. According to some embodiments, the lower insulating layer 110 may include an insulating material. According to some embodiments, the lower insulating layer 110 may include, but is not limited to, silicon oxide, silicon nitride, silicon oxynitride, etc.

According to some embodiments, the substrate 101 may be a semiconductor substrate including a semiconductor material such as single crystal silicon or single crystal germanium. The substrate 101 may include, for example, a semiconductor material such as silicon, germanium, silicon-germanium, etc., and may further include an epitaxial layer, a silicon on insulator (SOI) layer, a germanium on insulator (GOI) layer, a semiconductor on insulator (SeOI) layer, etc. A trench for defining an active region and an inactive region and a device separation (e.g., isolation) layer 102 filled in the trench may be formed on the substrate 101. The substrate 101 may include a cell array region CAR in which the plurality of memory cell strings CSTR of FIG. 1 are formed and a contact region CNTR for providing contact with respect to a gate electrode of the plurality of memory cell transistors MCT in the cell array region CAR.

According to some embodiments, the peripheral transistors 105 may constitute the decoder circuit 1110, the page buffer 1120, and the logic circuit 1130 illustrated in FIG. 1. According to some embodiments, the peripheral transistors 105 may constitute a common source line driver.

The peripheral circuit wiring may include a plurality of conductive patterns 115 sequentially stacked on the substrate 101. In addition, the peripheral circuit wiring may further include the peripheral transistors 105 and a plurality of conductive vias 111 connecting the plurality of conductive patterns 115 formed at different levels. According to some embodiments, the peripheral circuit wiring is illustrated as including three layers of conductive patterns 115 and the conductive vias 111 connecting the three layers of conductive patterns 115, but is not limited thereto. The peripheral circuit wiring may include one or more layers of conductive patterns and vias connecting the one or more layers of conductive patterns.

According to some embodiments, the conductive patterns 115 and the conductive vias 111 may include a conductive material. According to some embodiments, the conductive patterns 115 and the conductive vias 111 may include tungsten, tantalum, cobalt, nickel, tungsten silicide, tantalum silicide, cobalt silicide, or nickel silicide. According to some embodiments, the conductive patterns 115 and the conductive vias 111 may include polysilicon.

The second semiconductor device layer L2 may include the common source line CSL, first to third semiconductor layers 121, 122, and 123 disposed on the common source line CSL, a plurality of insulating layers and a plurality of gate electrodes 140 alternately and repeatedly stacked on first to third semiconductor layers 121, 122, and 123, and a first upper insulating layer 161 covering thereof. The second semiconductor device layer L2 may include channel structures 150 and a plurality of dummy channel structures 150D penetrating the plurality of insulating layers 130, the plurality of gate electrodes 140, and the first upper insulating layer 161. The second semiconductor device layer L2 may include a second upper insulating layer 163 covering underlying layers and filling a string selection line cut SSLC having a trench shape. The second semiconductor device layer L2 may include a third upper insulating layer 165 covering underlying layers and filling a word line cut WLC having a trench shape. According to some embodiments, the second semiconductor device layer L2 may further include wirings for the plurality of gate electrodes 140 and the channel structures 150 penetrating the plurality of gate electrodes 140 to operate as a memory cell array.

The plurality of gate electrodes 140 may extend from the cell array region CAR and the contact region CNTR. Parts of the plurality of gate electrodes 140 disposed in the cell array region CAR may serve as gate electrodes of ground transistors, string selection transistors, and memory cell transistors of the memory cell strings CSTR (see FIG. 1). The plurality of gate electrodes 140 in the contact region CNTR may constitute a stairstep structure in which the lower the plurality of gate electrodes 140 are disposed, the farther from the cell array region CAR in the X direction the plurality of gate electrodes 140 protrude. For example, an uppermost gate electrode 140(SE) may protrude in the X direction with respect to a lower gate electrode 140(SE).

The common source line CSL may be disposed on the first semiconductor device layer L1. According to some embodiments, the common source line CSL may have a flat plate shape. According to some embodiments, the common source line CSL may include tungsten (W) or a W compound.

First to third semiconductor layers 121, 122, and 123 may be disposed on the common source line CSL. Each of the first to third semiconductor layers 121, 122, and 123 may be a support layer supporting the plurality of insulating layers 130 and the plurality of gate electrodes 140. According to embodiments, any one of the first to third semiconductor layers 121, 122, and 123 may be omitted.

The first semiconductor layer 121 may be disposed on the common source line CSL. The second semiconductor layer 122 may be disposed on the first semiconductor layer 121, and the third semiconductor layer 123 may be disposed on the second semiconductor layer 122. According to some embodiments, the second semiconductor layer 122 may include an opening exposing an upper surface of the first semiconductor layer 121. According to some embodiments, the third semiconductor layer 123 may contact a portion of the first semiconductor layer 121 through the opening of the second semiconductor layer 122.

According to some embodiments, the first to third semiconductor layers 121, 122, and 123 may include crystalline or amorphous silicon. In some embodiments, the first to third semiconductor layers 121, 122, and 123 may be doped silicon layers. According to some embodiments, the first to third semiconductor layers 121, 122, and 123 may be doped at substantially the same concentration, but are not limited thereto.

According to some embodiments, the plurality of gate electrodes 140 may correspond to gate electrodes of the transistors illustrated in FIG. 1. More specifically, two lowermost gate electrodes 140(GE) may correspond to gate electrodes of the lower transistors LT1 and LT2 of FIG. 1, the two uppermost gate electrodes 140(SE) may correspond to gate electrodes of the upper transistors UT1 and UT2 of FIG. 1, and gate electrodes 140(WE) disposed therebetween may correspond to gate electrodes of the plurality of memory cell transistors MCT of FIG. 1.

According to some embodiments, one or more dummy gate electrodes may be additionally disposed between the gate electrodes 140(GE) and the gate electrodes 140(WE), and/or the corresponding gate electrodes 140(SE) and gate electrodes 140(WE). In this case, an inter-cell interference occurring between the plurality of adjacent gate electrodes 140 may be reduced.

According to some embodiments, the plurality of gate electrodes 140 may include a conductive material. According to some embodiments, each of the plurality of gate electrodes 140 may include a plurality of layers. For example, each of the plurality of gate electrodes 140 may include a first barrier, a second barrier, and a gate conductive layer. Each of the first barrier and the second barrier may have a conformal thickness, but is not limited thereto. According to some embodiments, the first barrier may include any one of a metal oxide (e.g., aluminum oxide), a metal nitride, and a metal oxynitride, and the second barrier may include a titanium nitride. The gate conductive layer may include, for example, a conductive material such as tungsten. As another example, the gate conductive layer may include tantalum, cobalt, nickel, tungsten silicide, tantalum silicide, cobalt silicide, or nickel silicide and polysilicon.

In some embodiments, the first and second contacts 171 and 173, bit line contacts 172, and first and second upper conductive patterns 181 and 183 to be described later may include any one or more of the materials described herein for the gate electrodes 140.

In some embodiments, the first and second upper insulating layers 161 and 163 may be disposed on the uppermost gate electrode 140(SE). The first and second upper insulating layers 161 and 163 may include an insulating material. According to embodiments, the string selection line cut SSLC may separate the gate electrodes 140(SE) and the first upper insulating layer 161, and the second upper insulating layer 163 may fill in the string selection line cut SSLC.

According to some embodiments, the plurality of channel structures 150 may penetrate the first upper insulating layer 161, the plurality of gate electrodes 140, and the plurality of insulating layers 130 on the cell array region CAR in the Z direction. According to some embodiments, the channel structures 150 may penetrate the second and third semiconductor layers 122 and 123. According to some embodiments, lower portions of the channel structures 150 may be surrounded by the first semiconductor layer 121. Accordingly, upper surfaces of the channel structures 150 may be coplanar with the first upper insulating layer 161, and lower surfaces of the channel structures 150 may be at a lower level than an upper surface of the first semiconductor layer 121. The adjacent channel structures 150 may be spaced apart from each other at a certain interval in the X and Y directions.

According to some embodiments, each of the channel structures 150 may include a plurality of layers. According to some embodiments, each of the channel structures 150 may include a gate insulating layer 155, a channel layer 153, and a filling insulating layer 151.

According to some embodiments, the gate insulating layer 155 may have a conformal thickness. According to some embodiments, the gate insulating layer 155 may constitute a bottom surface and an outer surface of the channel structure 150. Accordingly, according to some embodiments, the gate insulating layer 155 may insulate the channel layer 153 from the plurality of gate electrodes 140.

According to some embodiments, the gate insulating layer 155 may include a plurality of layers having a conformal thickness. According to some embodiments, the gate insulating layer 155 may include a tunnel insulating layer, a charge storage layer, and a blocking insulating layer. The tunnel insulating layer may include silicon oxide, hafnium oxide, aluminum oxide, zirconium oxide, tantalum oxide, etc. The charge storage layer may be a region in which electrons tunneling from the channel layer 153 are stored, and may include silicon nitride, boron nitride, silicon boron nitride, or polysilicon doped with impurities. The blocking insulating layer may include a dielectric material having a high dielectric constant value. The blocking insulating layer may include, for example, a single layer or a stacked layer of silicon oxide, silicon nitride, hafnium oxide, aluminum oxide, zirconium oxide, tantalum oxide, etc.

According to some embodiments, the gate insulating layer 155 may not be disposed on the same level as the second semiconductor layer 122. This is because a part of the gate insulating layer 155 is removed during a replacement process on the second semiconductor layer 122, and thus the second semiconductor layer 122 and the channel layer 153 may be connected to each other.

According to some embodiments, the channel layer 153 may be filled in an internal space defined by the gate insulating layer 155. The channel layer 153 formed on an inner wall of the gate insulating layer 155 may have a constant thickness. According to some embodiments, an upper portion of the channel layer 153 may have a greater thickness than a sidewall of the channel layer 153.

According to some embodiments, the filling insulating layer 151 may be filled in a space defined by the channel layer 153. An upper surface of the filling insulating layer 151 may be covered by the upper portion of the channel layer 153. According to some embodiments, the upper surface of the channel layer 153 may serve as a pad for providing an electrical connection to the bit line contacts 172. In some cases, a separate contact pad may be provided on the upper surface of the channel layer 153.

In FIG. 6A, the gate insulating layer 155 is illustrated as covering a lower surface of the channel layer 153, but is not limited thereto. For example, the gate insulating layer 155 may expose the lower surface of the channel layer 153 and constitute only a sidewall of the channel structure 150. In this case, a semiconductor pattern grown by a selective epitaxy growth process may contact the lower surface of the channel layer 153, and the channel layer 153 may not be directly connected to an upper substrate.

According to some embodiments, each of the plurality of dummy channel structures 150D may penetrate the first upper insulating layer 161, the plurality of gate electrodes 140, and the plurality of insulating layers 130 on the contact region CNTR in the Z direction. According to some embodiments, the plurality of dummy channel structures 150D may penetrate the second and third semiconductor layers 122 and 123. In some embodiments, lower portions of the plurality of dummy channel structures 150D may be surrounded by the first semiconductor layer 121. Accordingly, an upper surface of each of the plurality of dummy channel structures 150D may be coplanar with the first upper insulating layer 161, and a lower surface of each of the plurality of dummy channel structures 150D may be at a level lower than the upper surface of the first semiconductor layer 121.

The plurality of dummy channel structures 150D may be spaced apart from each other at a certain interval in the X and Y directions. According to embodiments, each of the cell gate contacts 171(CMC) is between (e.g., surrounded by) the four dummy channel structures 150D disposed at respective vertices of a square on a gate electrode 140, and the corresponding one of the cell gate contacts 171(CMC) is disposed at a midpoint of the square formed by the four adjacent dummy channel structures 150D, but the inventive concept is not limited thereto. More specifically, in the contact region CNTR, one of the cell gate contacts 171 (CMC) and four of the plurality of dummy channel structures 150D are formed in/on an exposed part of each of the plurality of gate electrodes 140, but the inventive concept is not limited thereto.

Here, the exposed parts of the plurality of gate electrodes 140 mean protruding parts on which additional (overlying) layers of the plurality of gate electrodes 140 are not disposed so that the corresponding cell gate contacts 171(CMC) are formed. Each of the plurality of gate electrodes 140 may protrude further in the X direction than one of the plurality of gate electrodes 140 immediately thereabove, and accordingly, a part of each of the plurality of gate electrodes 140 may be exposed. The exposed parts of the plurality of gate electrodes 140 may contact the first upper insulating layer 161.

A horizontal cross-sectional area of each of the plurality of dummy channel structures 150D may be greater than a horizontal cross-section of each of the channel structures 150. A horizontal cross-section of each of the plurality of dummy channel structures 150D may have an elliptical shape, unlike the channel structures 150. The plurality of dummy channel structures 150D may be support structures for inhibiting/preventing a stairstep structure composed of the plurality of gate electrodes 140 on the contact region CNTR from collapsing.

According to some embodiments, each of the plurality of dummy channel structures 150D may include a plurality of layers. According to some embodiments, each of the plurality of dummy channel structures 150D may include a dummy gate insulating layer 155D, a dummy channel layer 153D, and a dummy filling insulating layer 151D.

According to some embodiments, the dummy gate insulating layer 155D may have a conformal thickness. According to some embodiments, the dummy gate insulating layer 155D may constitute a bottom surface and an outer surface of the plurality of dummy channel structures 150D. Accordingly, according to some embodiments, the dummy gate insulating layer 155D may completely cover side surfaces and a lower surface of the dummy channel layer 153D, thereby insulating the dummy channel layer 153D from the plurality of gate electrodes 140 and the first to third semiconductor layers 121, 122, and 123.

According to some embodiments, the dummy gate insulating layer 155D may include a plurality of layers having a conformal thickness, similar to the gate insulating layer 155. According to some embodiments, the dummy gate insulating layer 155D may include a tunnel insulating layer, a charge storage layer, and a blocking insulating layer, similar to the gate insulating layer 155.

In some embodiments, the dummy gate insulating layer 155D may be disposed on the same level as the second semiconductor layer 122. Accordingly, the dummy channel layer 153D may be spaced apart from the second semiconductor layer 122 with the dummy gate insulating layer 155D therebetween. The dummy channel layer 153D may be insulated from the second semiconductor layer 122.

According to some embodiments, the dummy channel layer 153D may be filled in a part of an internal space defined by the dummy gate insulating layer 155D. The dummy channel layer 153D formed on an inner wall of the dummy gate insulating layer 155D may have a constant thickness. According to some embodiments, an upper portion of the dummy channel layer 153D may have a greater thickness than a sidewall of the dummy channel layer 153D.

According to some embodiments, the dummy filling insulating layer 151D may be filled in a space defined by the dummy channel layer 153D. An upper surface of the dummy filling insulating layer 151D may be covered by an upper portion of the dummy channel layer 153D. According to some embodiments, an upper surface of the dummy channel layer 153D may contact the dummy contact 171(DC).

According to some embodiments, the word line cut WLC may be a trench penetrating the first and second upper insulating layers 161 and 163, the plurality of gate electrodes 140, and the plurality of insulating layers 130 in the Z direction.

According to some embodiments, the word line cut WLC may penetrate a part of the first semiconductor layer 121, but is not limited thereto. According to some embodiments, the word line cut WLC may insulate the plurality of different gate electrodes 140 disposed at the same vertical level from each other. According to some embodiments, the word line cut WLC may extend in the X direction to separate the plurality of gate electrodes 140 in the Y direction. A length of the word line cut WLC in the X direction may be greater than a length of the plurality of gate electrodes 140 in the X direction. Accordingly, the word line cut WLC may completely separate the plurality of gate electrodes 140. Accordingly, the plurality of gate electrodes 140, which are horizontally spaced, may operate as gates of different transistors (e.g., a ground selection transistor, a memory cell transistor, and/or a string selection transistor).

According to some embodiments, the word line cut WLC may have a tapered shape in the Z direction. Here, the tapered shape may refer to a shape in which a horizontal width of the word line cut WLC decreases toward the first to third semiconductor layers 121, 122, and 123. Although not clearly illustrated, the plurality of gate electrodes 140 may have a recessed structure in a part adjacent to the word line cut WLC, compared to the plurality of adjacent insulating layers 130. Gate electrode materials may be recessed and formed in a node separation process to be described later.

Referring to FIG. 6A, it is illustrated that one string selection line cut SSLC is disposed between the adjacent word line cuts WLC, but the inventive concept is not limited thereto. For example, two or more string selection line cuts SSLC may be disposed between the adjacent word line cuts WLC.

The third upper insulating layer 165 may be disposed on the second upper insulating layer 163. The third upper insulating layer 165 may include an insulating material. The third upper insulating layer 165 may cover lower structures and be filled in the word line cut WLC.

According to some embodiments, the first and second contacts 171 and 173 and the bit line contacts 172 may extend at the same level as at least a part of the third upper insulating layer 165 in the Z direction. According to some embodiments, the first contacts 171 and the bit line contacts 172 may further penetrate the second upper insulating layer 163.

The first contacts 171 may include the cell gate contacts 171(CMC) and the dummy contacts 171(DC). Upper surfaces of the cell gate contacts 171(CMC) and the dummy contacts 171(DC) may be at the same level (e.g., may be coplanar). Lower surfaces, however, of the cell gate contacts 171(CMC) and the dummy contacts 171(DC) may be at different levels. For example, lower surfaces of the dummy contacts 171(DC) may be farther than lower surfaces of the cell gate contacts 171(CMC) from the upper surface of the substrate 101.

According to embodiments, horizontal cross-sectional areas of the cell gate contacts 171(CMC) may be different from horizontal cross-sectional areas of the dummy contacts 171(DC). According to embodiments, the horizontal cross-sectional areas of the cell gate contacts 171(CMC) may be greater than the horizontal cross-sectional areas of the dummy contacts 171(DC). According to embodiments, horizontal areas of the upper surfaces of the cell gate contacts 171(CMC) may be greater than horizontal areas of the upper surfaces of the dummy contacts 171(DC).

According to some embodiments, the bit line contacts 172 may contact the channel layers 153, the cell gate contacts 171(CMC) may contact the plurality of gate electrodes 140 of the contact region, and the dummy contacts 171(DC) may contact the dummy channel layers 153D.

According to some embodiments, the first upper conductive pattern 181 may be formed on the cell gate contacts 171(CMC). The cell gate contacts 171(CMC) may be configured to be electrically connected to the first upper conductive pattern 181.

According to some embodiments, the first upper conductive patterns 181 may not be formed on the dummy contacts 171(DC). Accordingly, the dummy contacts 171(DC) may not be vertically overlapped by the first upper conductive patterns 181 and may be horizontally spaced apart from each other. According to some embodiments, upper surfaces of the dummy contacts 171(DC) may contact the third upper insulating layer 165.

The second contacts 173 and the second upper conductive patterns 183 may be formed on the first upper conductive patterns 181. The second contacts 173 may extend in the third upper insulating layer 165 in the Z direction. The second contacts 173 may be configured to be electrically connected to the first upper conductive pattern 181.

The second upper conductive patterns 183 may extend in a horizontal direction (i.e., X-direction and Y-direction). The second upper conductive patterns 183 may include bit lines 183(BL) and word lines 183(WL). The second upper conductive patterns 183 may be configured to be electrically connected to the second contacts 173.

The bit lines 183(BL) may overlap the channel structures 150 in the Z direction and may extend in the Y direction. Two bit lines 183(BL) may pass over each of the channel structures 150. In some embodiments, neither the bit lines 183(BL) nor the word lines 183(WL) may vertically overlap the dummy contacts 171(DC) in the Z direction.

In other embodiments, at least one of the first upper conductive patterns 181, the second contacts 173, or the second upper conductive patterns 183 may be formed on the dummy contacts 171(DC). In this case, the dummy contacts 171(DC) may be vertically overlapped by at least one of the first upper conductive patterns 181, the second contacts 173, or the second upper conductive patterns 183. Even in this case, the dummy contacts 171(DC) may be electrically floating without being connected to an external control circuit, etc.

According to embodiments, the semiconductor device 100 may include the dummy contacts 171(DC) formed on the plurality of dummy channel structures 150D in the contact region CNTR. Accordingly, in an etching process for forming the cell gate contacts 171(CMC) which will be described later, the plurality of dummy channel structures 150D may operate as a floating capacitor to inhibit/prevent the shape of the cell gate contacts 171(CMC) from being distorted, and thus, the reliability of the semiconductor device 100 may be improved.

FIGS. 7A to 7G are plan views illustrating semiconductor devices 100a, 100b, 100c, 100d, 100e, 100f, and 100g according to other embodiments.

For convenience of description, redundant descriptions with those given with reference to FIGS. 5 to 6B may be omitted, and differences will be mainly described.

Figure 7A:
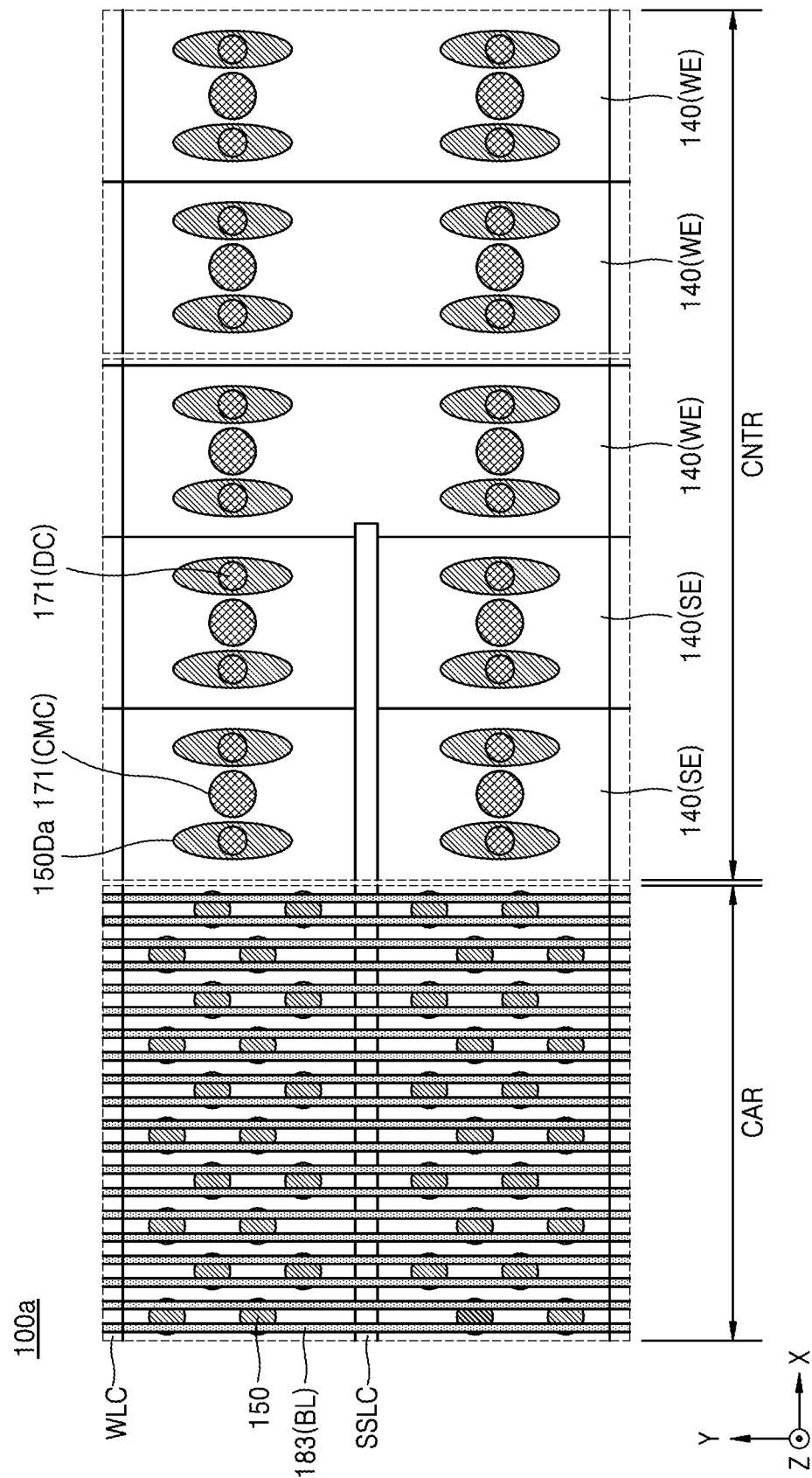

Referring to FIG. 7A, the semiconductor device 100a is similar to the semiconductor device 100 of FIG. 5, but may include two dummy channel structures 150Da in exposed parts of the plurality of gate electrodes 140 between the word line cut WLC and the string selection line cut SSLC in the contact region CNTR. The two dummy channel structures 150Da may be spaced apart from each other in an X direction with one cell gate contact 171(CMC) therebetween.

A horizontal cross-section of each of the two dummy channel structures 150Da may be an ellipse with a major axis parallel to a Y direction (e.g., a bit line extension direction) and a minor axis parallel to the X direction (e.g., a stairs direction). One dummy contact 171(DC) may be formed in each of the dummy channel structures 150Da.

According to embodiments, as sizes of the dummy channel structures 150Da increase, the gate electrodes 140 of the contact region CNTR may be supported using a smaller number of dummy channel structures 150Da. Accordingly, the number and density of the dummy contacts 171(DC) are reduced, and thus a burden of optical proximity correction of a reticle for forming the dummy contacts 171(DC) may be reduced, and a productivity of the semiconductor device 100a may be improved.

Figure 7B:
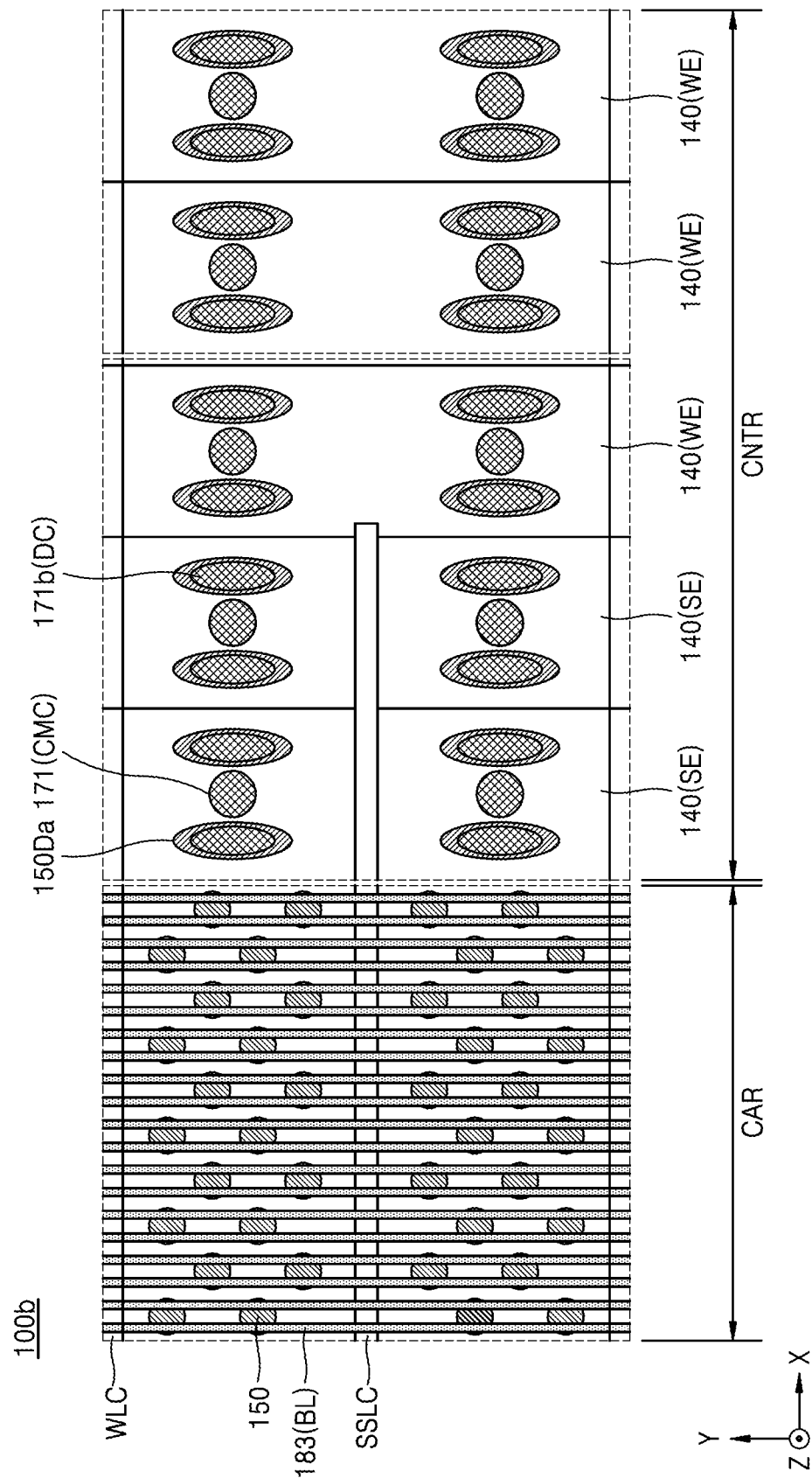

Referring to FIG. 7B, the semiconductor device 100b is similar to the semiconductor device 100 of FIG. 7A, but a horizontal cross-section of each of the dummy contacts 171b(DC) may be an ellipse with a major axis parallel to the Y direction (e.g., the bit line extension direction) and a minor axis parallel to the X direction (e.g., the stairs direction).

According to embodiments, the burden of optical proximity correction of the reticle for forming the dummy contacts 171(DC) may be reduced, and the productivity of the semiconductor device 100b may be improved.

Referring to FIG. 7C, the semiconductor device 100c is similar to the semiconductor device 100 of FIG. 5, but may include two dummy channel structures 150Dc in exposed parts of the plurality of gate electrodes 140 between the word line cut WLC and the string selection line cut SSLC in the contact region CNTR. Adjacent two of the dummy channel structures 150Dc may be spaced apart from each other in the Y direction with a corresponding one of the cell gate contacts 171(CMC) therebetween.

A horizontal cross-section of each of the two dummy channel structures 150Dc may be an ellipse with a minor axis parallel to the Y direction (e.g., the bit line extension direction) and a major axis parallel to the X direction (e.g., the stairs direction). One dummy contact 171(DC) may be formed in each of the dummy channel structures 150Dc.

According to embodiments, the number and density of the dummy contacts 171(DC) are reduced, and thus the burden of optical proximity correction of the reticle for forming the dummy contacts 171(DC) may be reduced, and the productivity of the semiconductor device 100c may be improved.

Figure 7D:
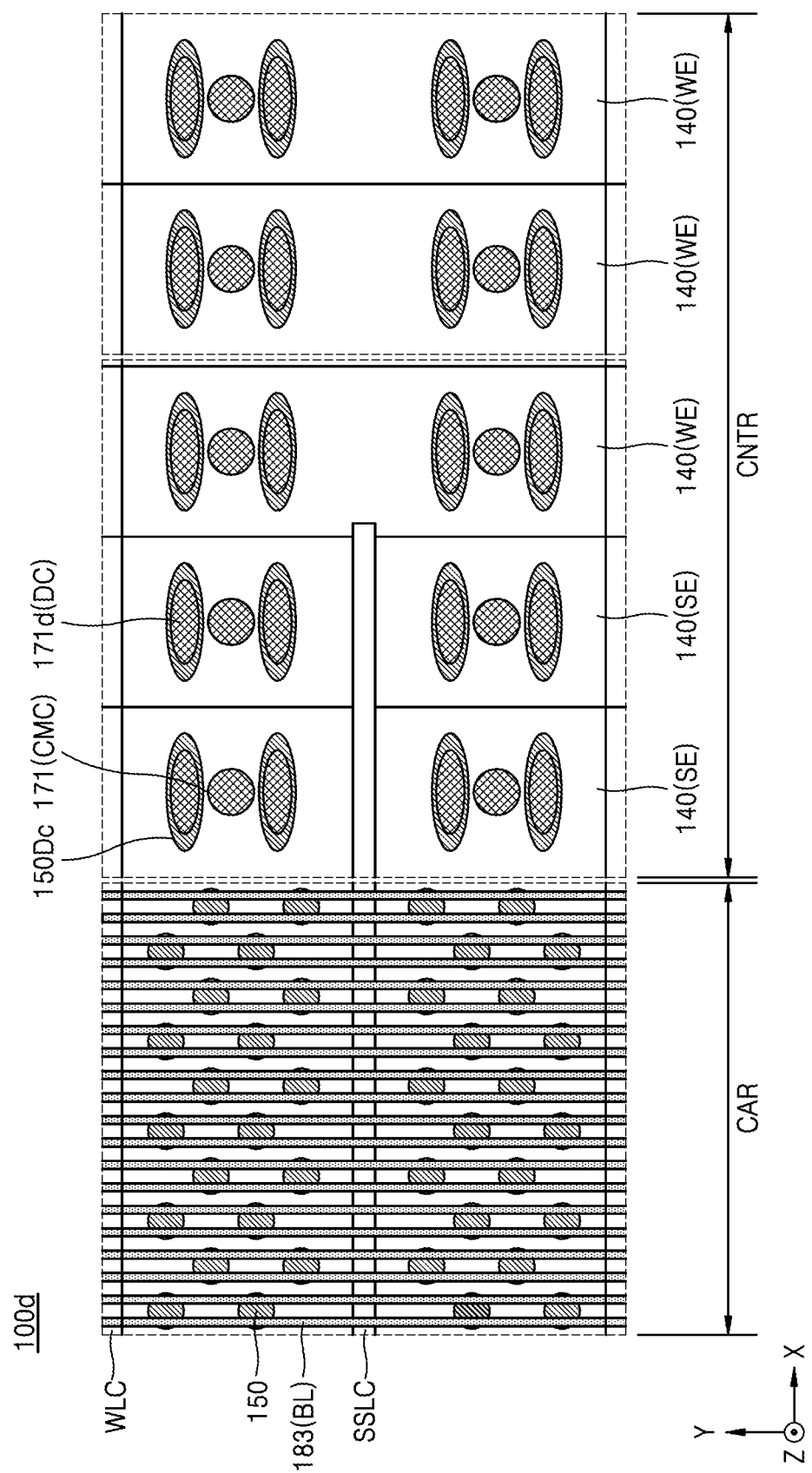

Referring to FIG. 7D, the semiconductor device 100d is similar to the semiconductor device 100c of FIG. 7C, but a horizontal cross-section of each of the dummy contacts 171d(DC) may be an ellipse with a minor axis parallel to the Y direction (e.g., the bit line extension direction) and a major axis parallel to the X direction (e.g., the stairs direction).

According to embodiments, the burden of optical proximity correction of the reticle for forming the dummy contacts 171(DC) may be reduced, and the productivity of the semiconductor device 100d may be improved.

Figure 7E:
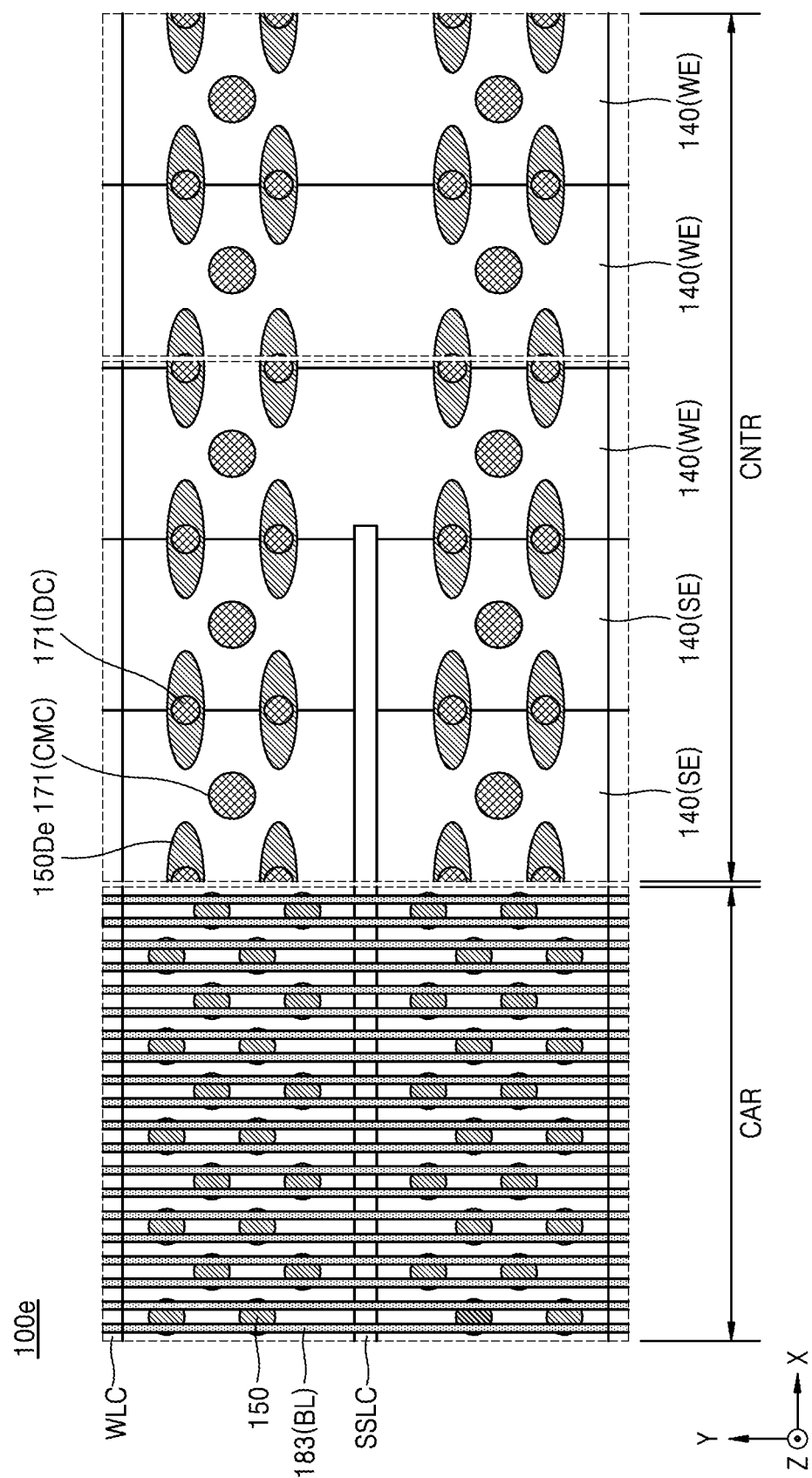

Referring to FIG. 7E, the semiconductor device 100e is similar to the semiconductor device 100c of FIG. 7C, but dummy channel structures 150De may penetrate exposed parts of the different gate electrodes 140. For example, the four dummy channel structures 150De arranged third from the left in the drawing may penetrate an exposed part of the second gate electrode 140(SE) from the top and an exposed part of the third gate electrode 140(WE) from the top.

The four dummy channel structures 150De may be disposed to cross the cell gate contacts 171(CMC). More specifically, the cell gate contacts 171(CMC) may not be disposed between the two dummy channel structures 150De aligned in the Y direction. Each of the dummy channel structures 150De may be an ellipse with a minor axis parallel to the Y direction (e.g., the bit line extension direction) and a major axis parallel to the X direction (e.g., the stairs direction).

According to embodiments, the burden of optical proximity correction of the reticle for forming the dummy contacts 171(DC) may be reduced, and the productivity of the semiconductor device 100d may be improved.

Figure 7F:
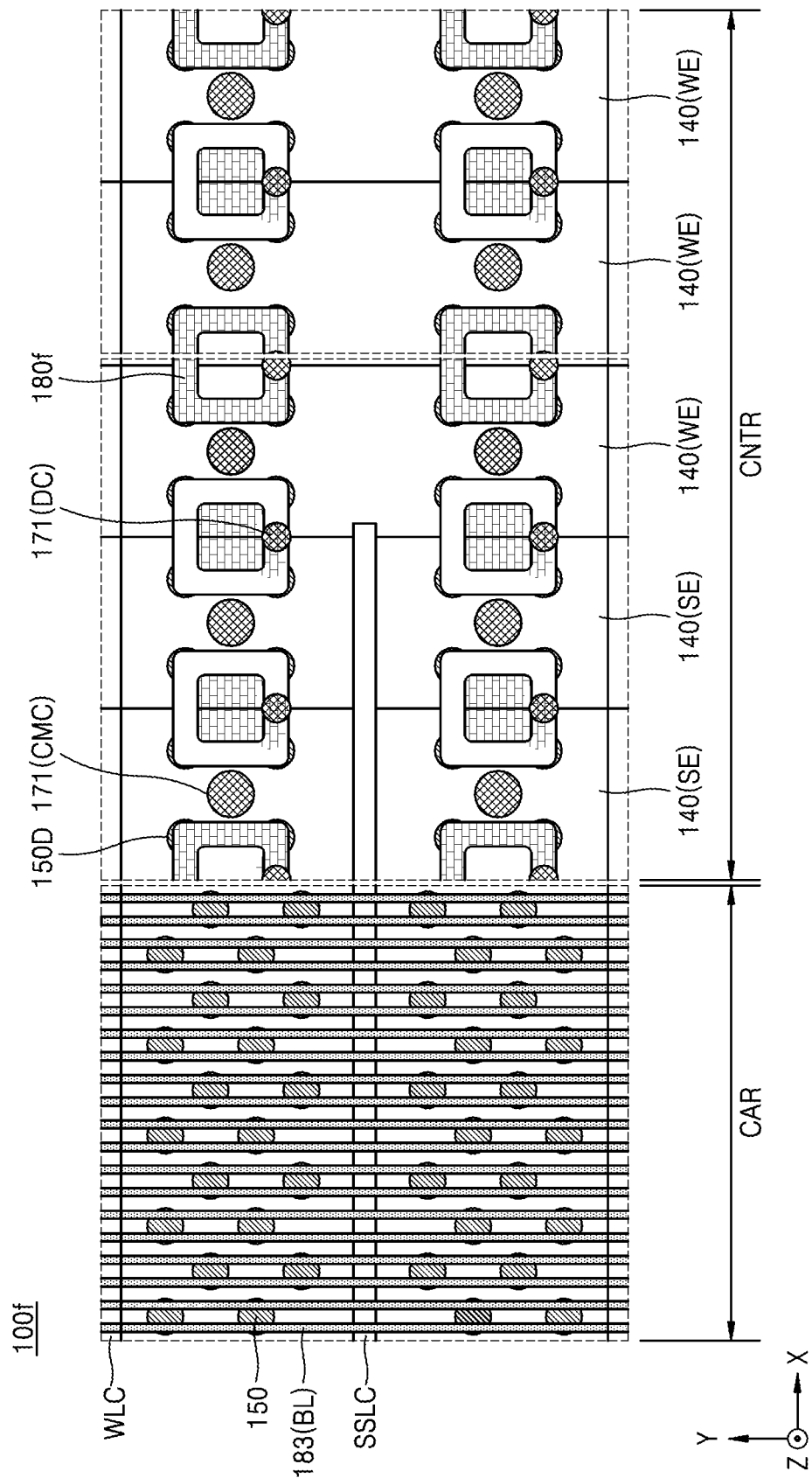

Referring to FIG. 7F, the semiconductor device 100f is similar to the semiconductor device 100 of FIG. 5, but may further include a plurality of connection patterns 180f interposed between the plurality of dummy channel structures 150D and the dummy contact 171(DC). Accordingly, the plurality of dummy channel structures 150D and the plurality of dummy contacts 171(DC) may be connected in the Z direction with the plurality of connection patterns 180f therebetween. The plurality of connection patterns 180f may be a hollow square having round corners when viewed from above.

The plurality of connection patterns 180f may be alternately disposed in the X direction with the plurality of cell gate contacts 171(CMC). For example, a corresponding one of the plurality of cell gate contacts 171(CMC) may be disposed between adjacent two of the plurality of connection patterns 180f, and a corresponding one of the plurality of connection patterns 180f may be disposed between adjacent two of the plurality of cell gate contacts 171(CMC).

According to embodiments, the plurality of connection patterns 180f may be configured to be electrically connected to the plurality of dummy channel structures 150D. According to embodiments, the plurality of connection patterns 180f may be configured to be electrically connected to at least two of the plurality of dummy channel structures 150D. According to embodiments, the plurality of connection patterns 180f may be configured to be electrically connected to four of the plurality of dummy channel structures 150D.

According to embodiments, the plurality of connection patterns 180f may be configured to be electrically connected to the plurality of dummy contacts 171(DC). According to embodiments, each of the plurality of connection patterns 180f may be configured to be electrically connected to a corresponding one of the plurality of dummy contacts 171 (DC).

According to embodiments, the plurality of dummy contacts 171(DC) may be configured to be electrically connected to the plurality of dummy channel structures 150D through the plurality of connection patterns 180f. The plurality of dummy contacts 171(DC) may not overlap the plurality of dummy channel structures 150D in the Z direction. The plurality of dummy contacts 171(DC) may be spaced apart from the plurality of dummy channel structures 150D horizontally (i.e., in the X and Y directions).

According to embodiments, the burden of optical proximity correction of the reticle for forming the dummy contacts 171(DC) may be reduced, and the productivity of the semiconductor device 100f may be improved.

Referring to FIG. 7G, the semiconductor device 100g may be similar to the semiconductor device 100f of FIG. 7F, but may be in an H shape when viewed from the top of a shape of a connection pattern 180g.

Figure 8:
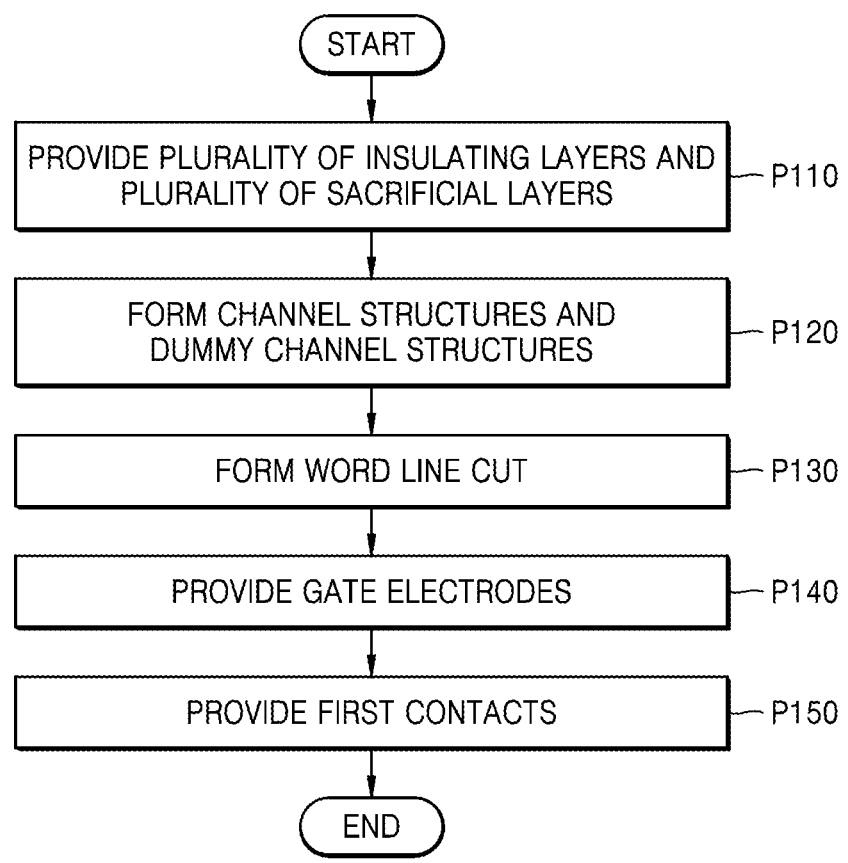
FIG. 8 is a flowchart illustrating a method of manufacturing a semiconductor device according to embodiments.

FIG. 8 is a flowchart illustrating a method of manufacturing a semiconductor device according to embodiments.

FIGS. 9A to 16B are cross-sectional views illustrating a method of manufacturing a semiconductor device according to embodiments.

More specifically, FIGS. 9A, 10A, 11A, 12A, 13A, 14A, 15A, and 16A are cross-sectional views of a part corresponding to FIG. 6A, and FIGS. 9B, 10B, 11B, 12B, 13B, 14B, 15B, and 16B are cross-sectional views of a part corresponding to FIG. 6B.

Figure 9A:
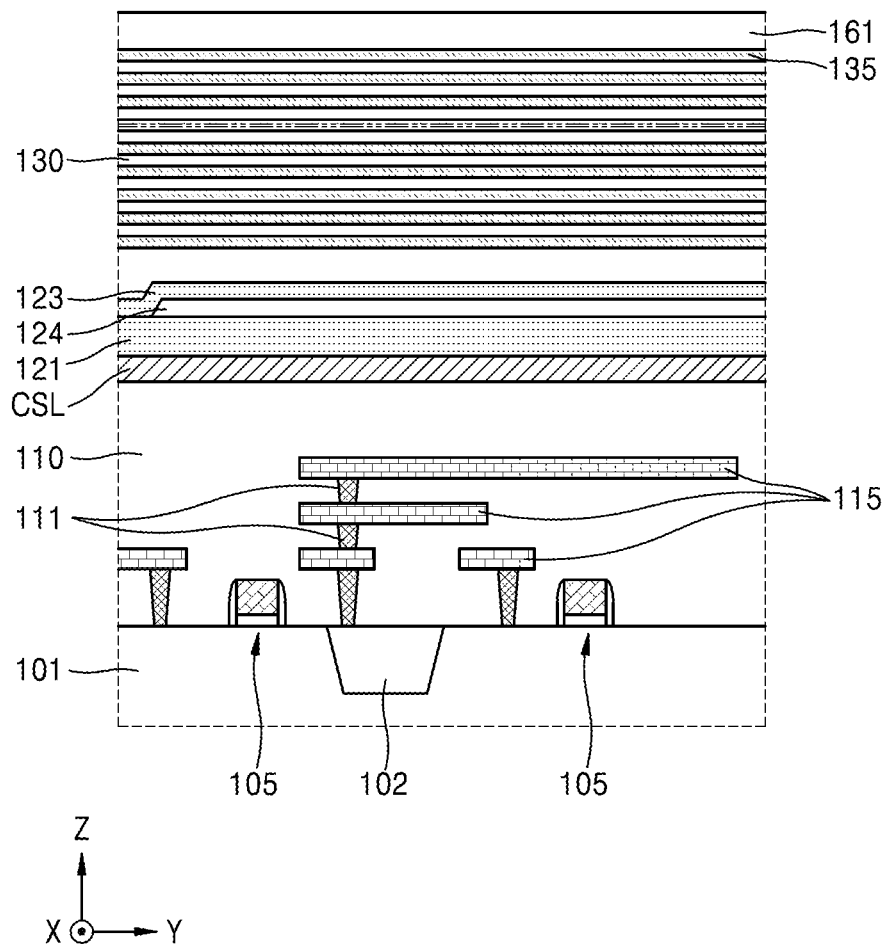
FIGS. 9A, 9B, 10A, 10B, 11A, 11B, 12A, 12B, 13A, 13B, 14A, 14B, 15A, 15B, 16A, and 16B are cross-sectional views illustrating a method of manufacturing a semiconductor device according to embodiments.
Figure 9B:
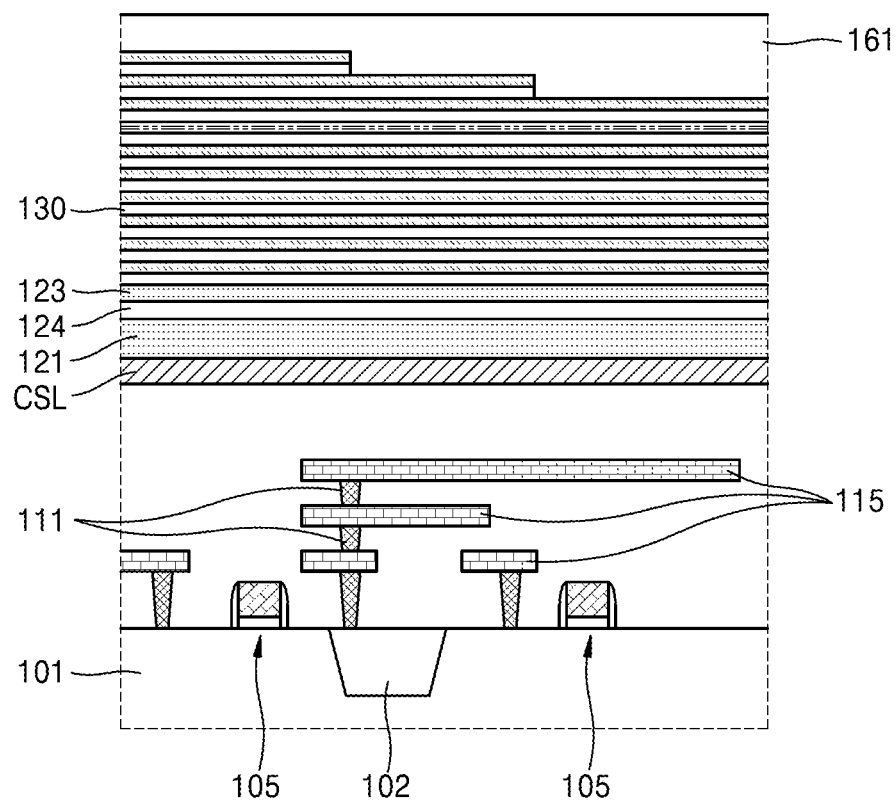

Referring to FIGS. 8 to 9B, a plurality of insulating layers 130 and a plurality of sacrificial layers 135 may be provided in P110.

Before providing the plurality of insulating layers 130 and the plurality of sacrificial layers 135, providing the first semiconductor device layer L1 may include forming the device separation layer 102 on the substrate 101, performing a first ion injection process using a photoresist pattern on the substrate 101 to sequentially (or in the reverse order) form a p-well region and an n-well region on the substrate 101, forming the peripheral transistors 105, patterning a conductive material and providing an insulating material, thereby forming a peripheral circuit wiring including the conductive vias 111 and the conductive patterns 115 and the lower insulating layer 110 covering the peripheral circuit wiring.

The common source line CSL and the first semiconductor layer 121 may be provided on the lower insulating layer 110. The common source line CSL and the first semiconductor layer 121 may be formed by using a chemical vapor deposition process, an atomic layer deposition process, a physical vapor deposition process, etc.

The lower sacrificial layer 124 may be provided on the first semiconductor layer 121 and a part thereof may be patterned and removed and then, the third semiconductor layer 123 may be conformally provided thereon. Accordingly, the first semiconductor layer 121 and the third semiconductor layer 123 may contact each other at a part where the lower sacrificial layer 124 is removed. The first and third semiconductor layers 121 and 123 may include doped silicon.

According to some embodiments, the lower sacrificial layer 124 may include an insulating material. According to some embodiments, the lower sacrificial layer 124 may include any one of silicon oxide, silicon nitride, and silicon oxynitride. According to some embodiments, the lower sacrificial layer 124 may have a high etch selectivity with respect to the plurality of insulating layers 130.

Subsequently, the plurality of sacrificial layers 135 and the plurality of insulating layers 130 may be alternately stacked on the third semiconductor layer 123. According to some embodiments, the plurality of insulating layers 130 and the plurality of sacrificial layers 135 may include different materials. According to some embodiments, the plurality of insulating layers 130 and the plurality of sacrificial layers 135 may have a high etch selectivity to each other. For example, when the plurality of sacrificial layers 135 include silicon oxide, the plurality of insulating layers 130 may include silicon nitride. As another example, when the plurality of sacrificial layers 135 include silicon nitride, the plurality of insulating layers 130 may include silicon oxide. As another example, when the plurality of sacrificial layers 135 include undoped polysilicon, the plurality of insulating layers 130 may include silicon nitride or silicon oxide. The first upper insulating layer 161 may be provided on an uppermost sacrificial layer 135.

The plurality of sacrificial layers 135 may constitute a stairstep structure similar to that of the gate electrodes 140 described above in the contact region CNTR. Accordingly, each of the plurality of sacrificial layers 135 may include an exposed part on the contact region CNTR.

Figure 10A:
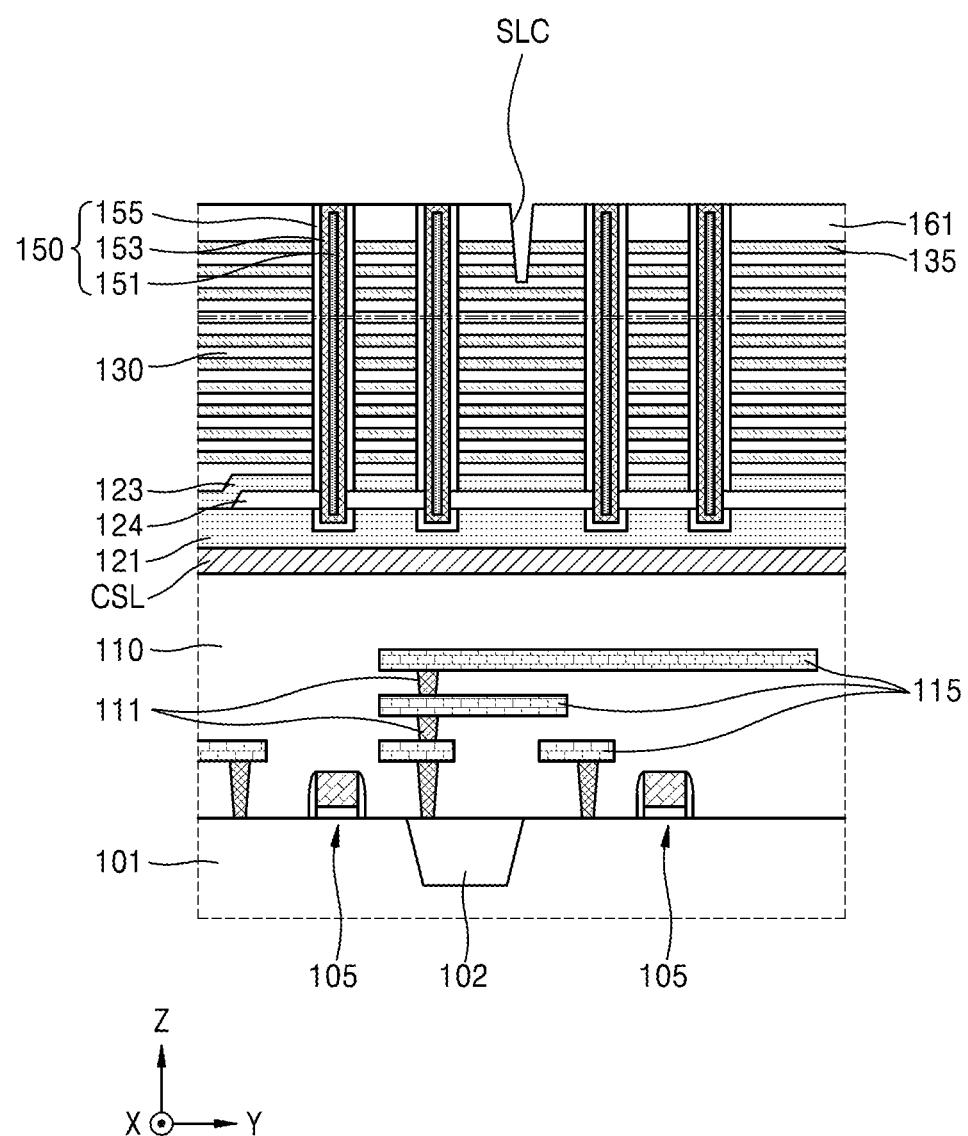
Figure 10B:
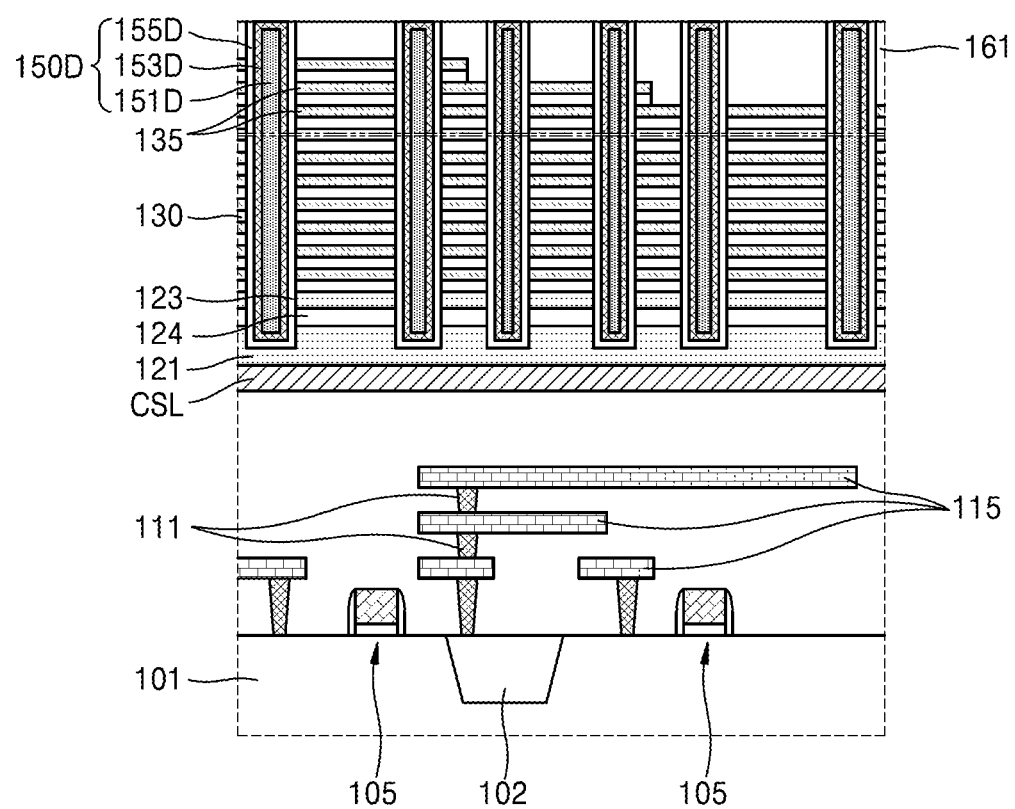

Referring to FIGS. 8, 10A, and 10B, the channel structures 150 and the dummy channel structures 150D may be formed in P120.

To form the channel structures 150 and the plurality of dummy channel structures 150D, after providing a photoresist material layer on the first upper insulating layer 161, exposure, development, and etching operations may be sequentially performed to form a plurality of channel holes and dummy channel holes penetrating the first upper insulating layer 161, the plurality of insulating layers 130, the plurality of sacrificial layers 135, the third semiconductor layer 123, and the lower sacrificial layer 124. The channel holes may be formed in the cell array region CAR, and the dummy channel holes may be formed in the contact region CNTR. Structures of the dummy channel holes may be the same as any one of those described with reference to FIGS. 5 to 7G.

Subsequently, a gate insulating material layer, a channel material layer, and a filling insulating layer filled in each of the channel holes and at least some of the dummy channel holes may be sequentially and conformally provided. According to some embodiments, the gate insulating material layer may include a charge blocking material layer, a charge storage material layer, and a tunnel insulating material layer that are sequentially provided. Thereafter, an etch-back process may be performed so that an upper surface of the first upper insulating layer 161 is exposed. Subsequently, after an upper portion of a filling insulating material layer in the channel holes is further removed, the same material as the channel material layer may be deposited so that an upper portions of the filling insulating layer 151 may be covered. An upper portion of each of the channel layers 153 may provide pads for contacting the bit line contacts 172 (see FIG. 6A).

Accordingly, the channel structures 150 including the gate insulating layer 155, the channel layer 153, and the filling insulating layer 151, and the dummy channel structures 150D including the dummy gate insulating layer 155D, the dummy channel layer 153D and the dummy filling insulating layer 151D may be formed.

Subsequently, the string selection line cut SSLC may be formed. According to some embodiments, the string selection line cut SSLC may be formed by dry etching the two sacrificial layers 135 positioned farthest from the third semiconductor layer 123 to be horizontally separated from each other.

Figure 11A:
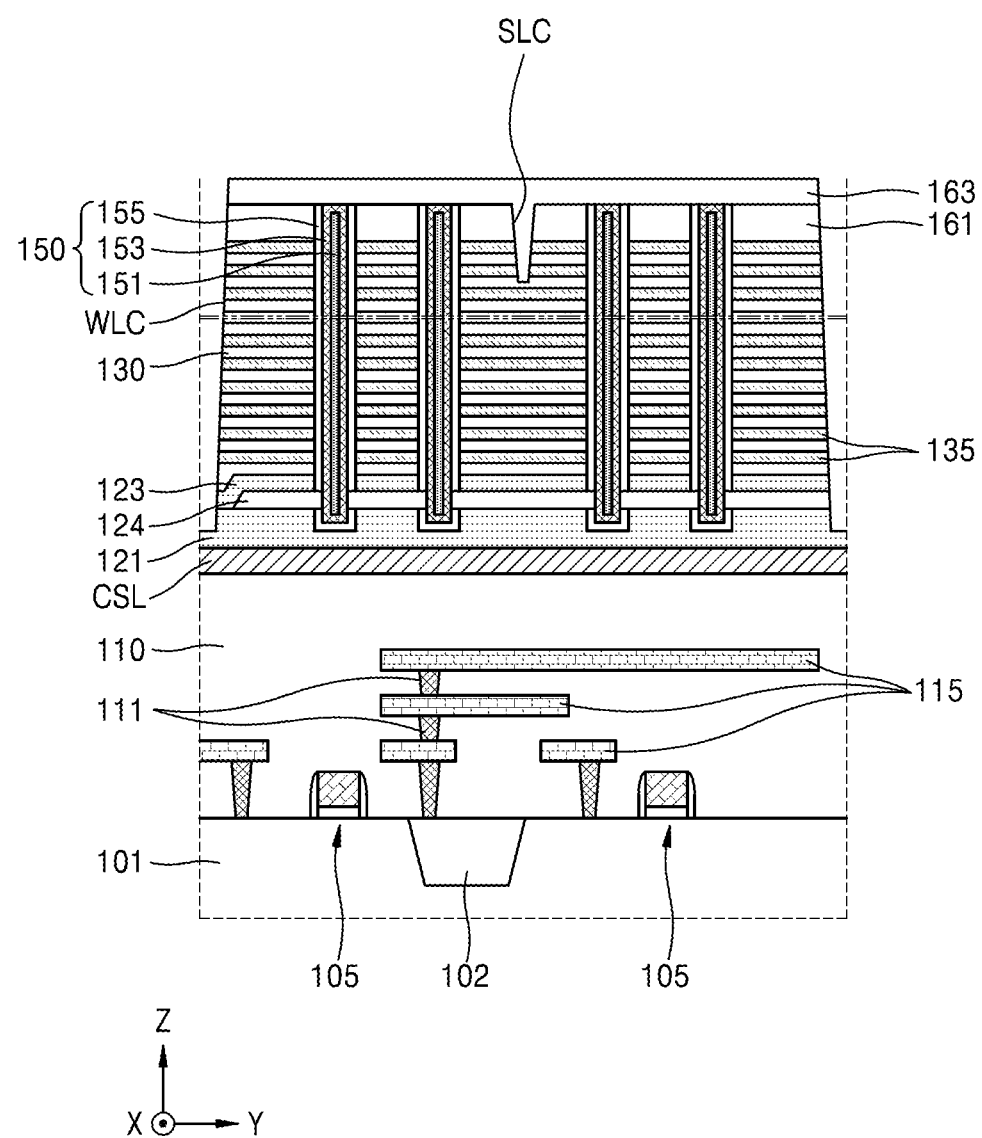
Figure 11B:
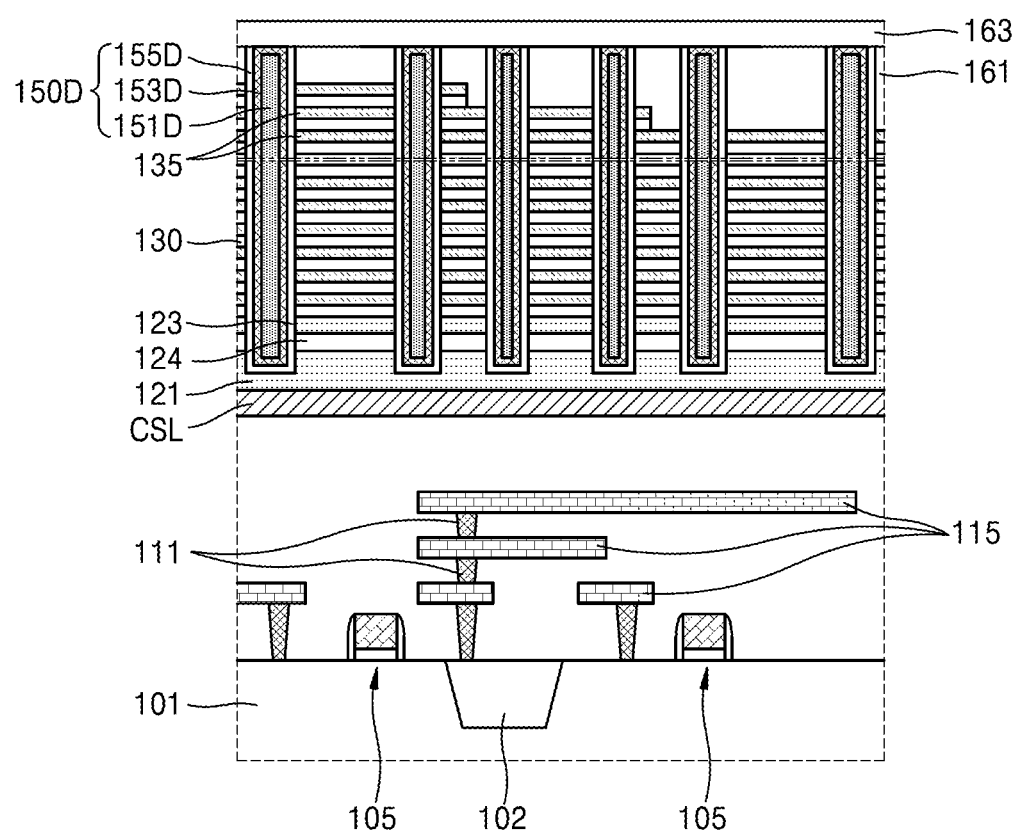
Figure 12A:
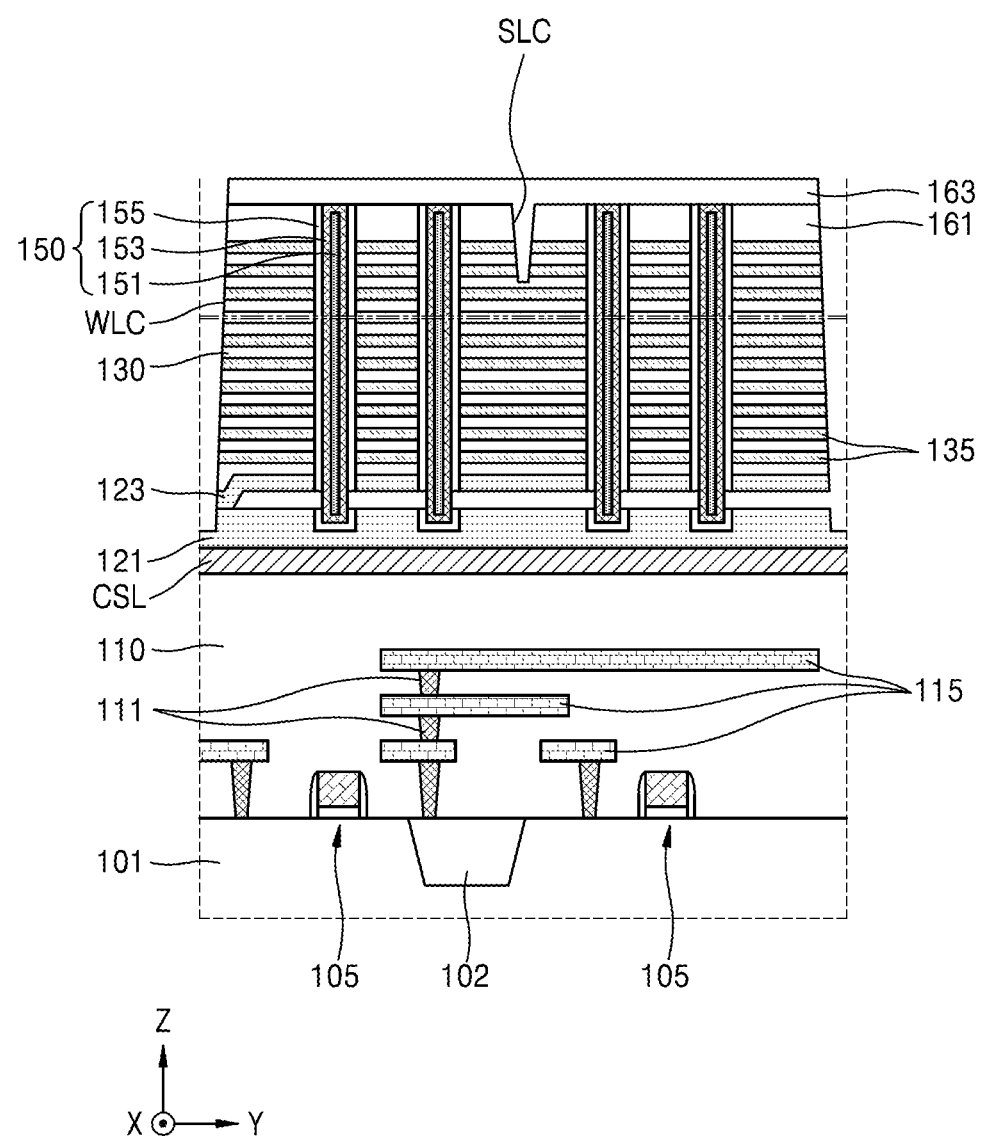
Figure 12B:
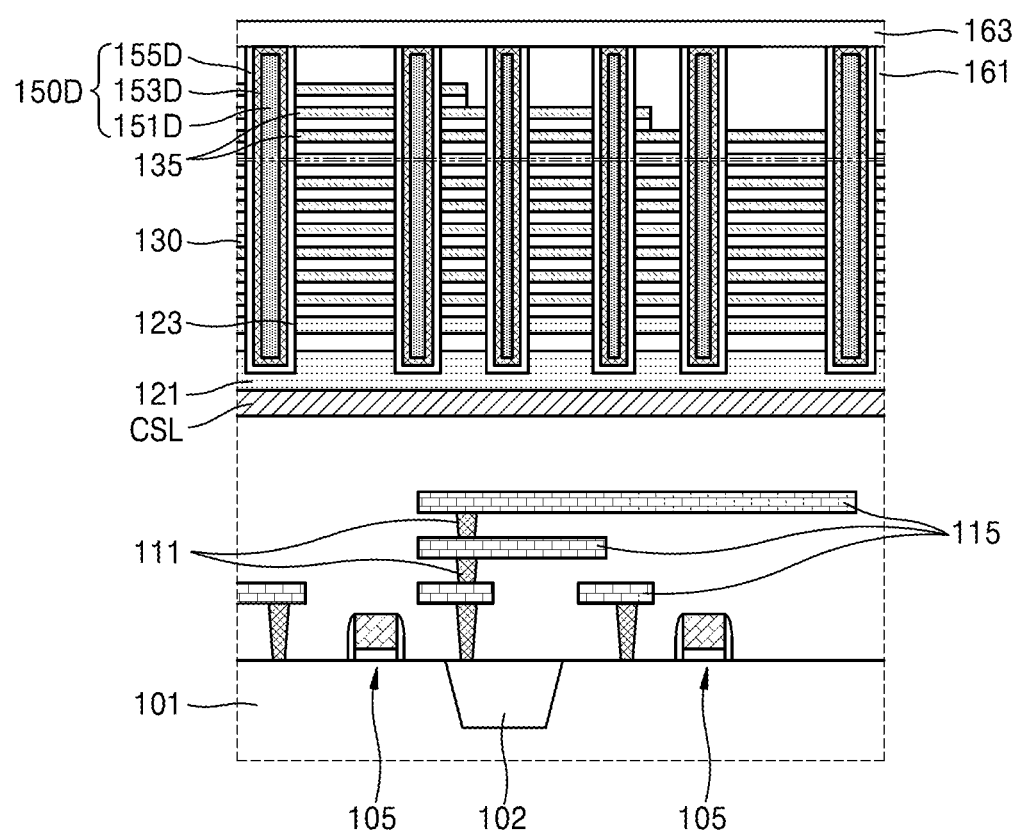

Referring to FIGS. 8, 11A, and 11B, the word line cut WLC may be formed in P130. According to some embodiments, forming the word line cut WLC may include, after sequentially providing the second upper insulating layer 163 covering upper surfaces of the channel structures 150 and an upper surface of the first upper insulating layer 161 and a hard mask pattern, etching the first and second upper insulating layers 161 and 163, the plurality of sacrificial layers 135, and the plurality of insulating layers 130 using the mask pattern as an etching mask.

After the word line cut WLC is formed, the hard mask pattern may be removed. According to some embodiments, the word line cut WLC may have a tapered shape in the Z direction. According to some embodiments, a length of the word line cut WLC in the X direction may be greater than a length of each of the plurality of sacrificial layers 135 in the X-direction. Accordingly, the word line cut WLC may horizontally separate the plurality of sacrificial layers 135 from each other.

Subsequently, referring to FIGS. 11A to 12B, the lower sacrificial layer 124 may be removed.

According to some embodiments, a word line cut liner may be formed by providing a word line cut liner material layer on the word line cut WLC and then removing a lower portion of the word line cut liner material layer. The word line cut liner may be a material having a high etch selectivity with respect to the lower sacrificial layer 124. The plurality of sacrificial layers 135 may be covered by the word line cut liner, but the lower sacrificial layer 124 may be exposed. The word line cut liner may be a layer for protecting the plurality of sacrificial layers 135 in a process of removing the lower sacrificial layer 124.

Even when the lower sacrificial layer 124 is removed, respective portions of the first semiconductor layer 121 and the third semiconductor layer 123 contact each other, thereby inhibiting/preventing the plurality of insulating layers 130 and the plurality of sacrificial layers 135 from collapsing. After removing the lower sacrificial layer 124, the word line cut liner may be removed.

Figure 13A:
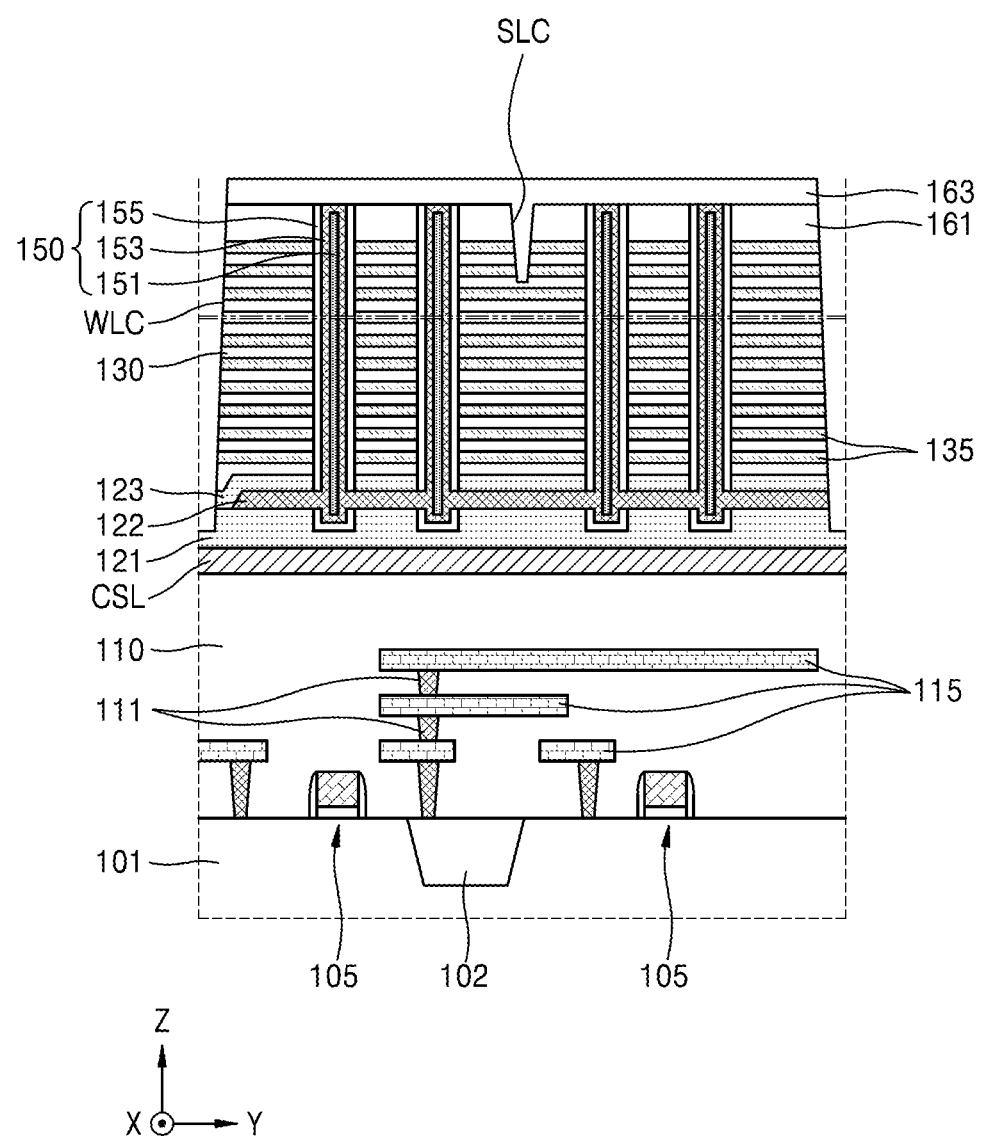
Figure 13B:
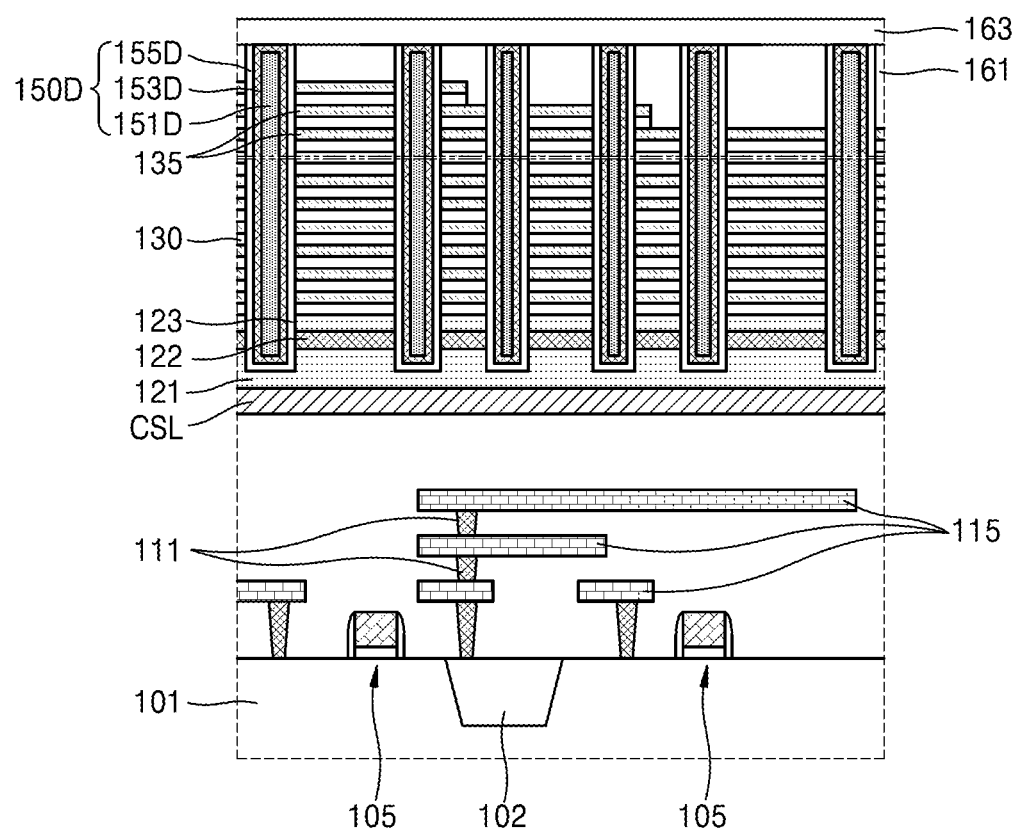
Figure 14A:
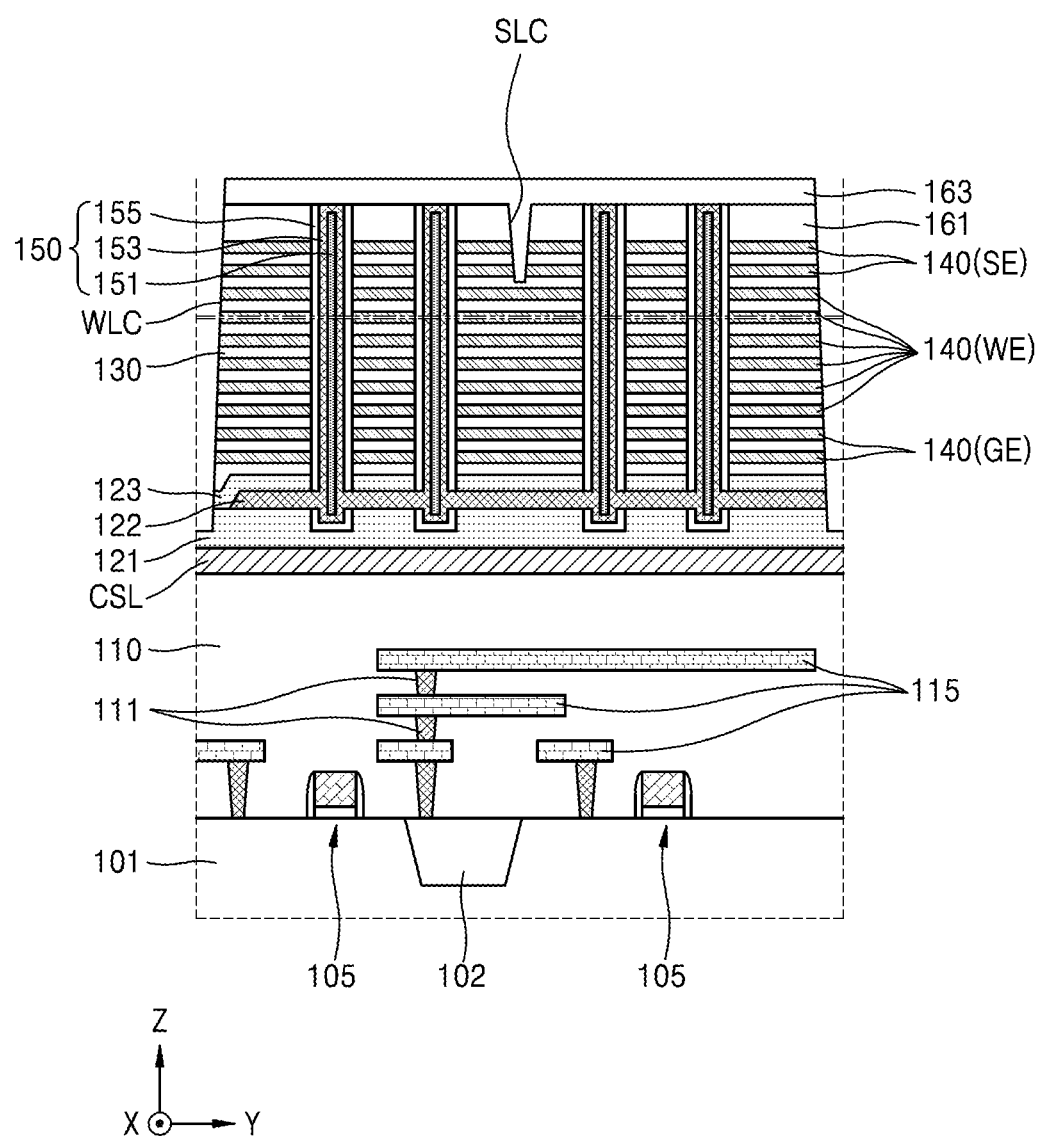
Figure 14B:
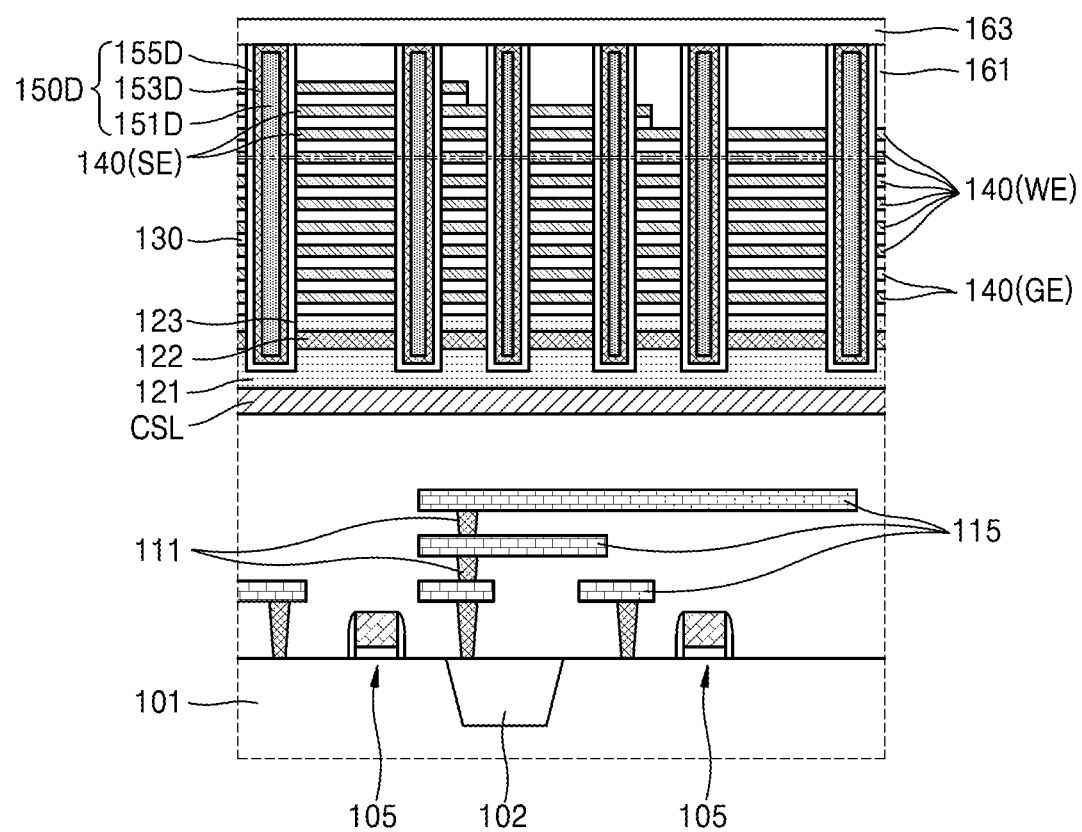

Thereafter, referring to FIGS. 13A and 13B, the second semiconductor layer 122 may be formed.

Forming the second semiconductor layer 122 may include removing a part of the gate insulating layer 155 and providing the second semiconductor layer 122. According to embodiments, the gate insulating layer 155 may be removed by wet etching.

Subsequently, the second semiconductor layer 122 may be provided in a space formed by a selective removal of the sacrificial layer 124 (see FIG. 11A). According to some embodiments, the second semiconductor layer 122 may include silicon doped at substantially the same concentration as those of the first and third semiconductor layers 121 and 123. According to some other embodiments, the second semiconductor layer 122 may include silicon doped at a concentration different from those of the first and third semiconductor layers 121 and 123, or undoped silicon. According to some embodiments, the second semiconductor layer 122 may be doped at substantially the same concentration as those of the first and third semiconductor layers 121 and 123 because dopants of the first and third semiconductor layers 121 and 123 are diffused by a subsequent heat treatment process. The second semiconductor layer 122 may contact the channel layer 153. Accordingly, a charge movement path for each of the plurality of channel structures 150 to operate as a memory cell string may be formed. The second semiconductor layer 122 may be spaced apart from the dummy channel layer 153D and may not contact the dummy channel layer 153D.

Subsequently, referring to FIGS. 8 and 13A to 14B, the plurality of gate electrodes 140 may be formed in P140. Forming the plurality of gate electrodes 140 may include removing the plurality of sacrificial layers 135 through wet etching, providing a gate electrode material to a space from which the plurality of sacrificial layers 135 are removed through word line cut WLC, and removing the gate electrode material in the word line cut WLC through wet etching for node separation.

Figure 15A:
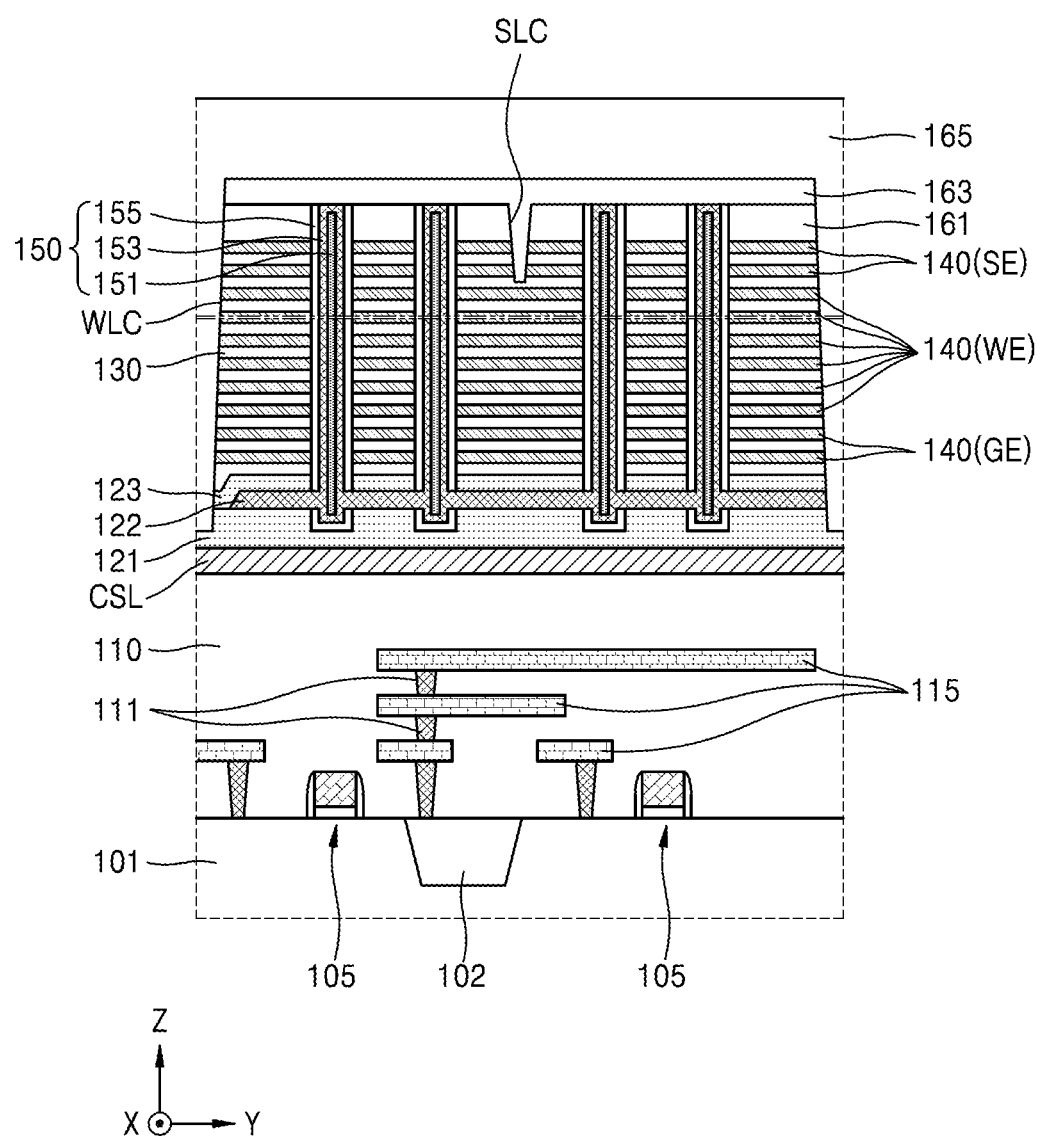
Figure 15B:
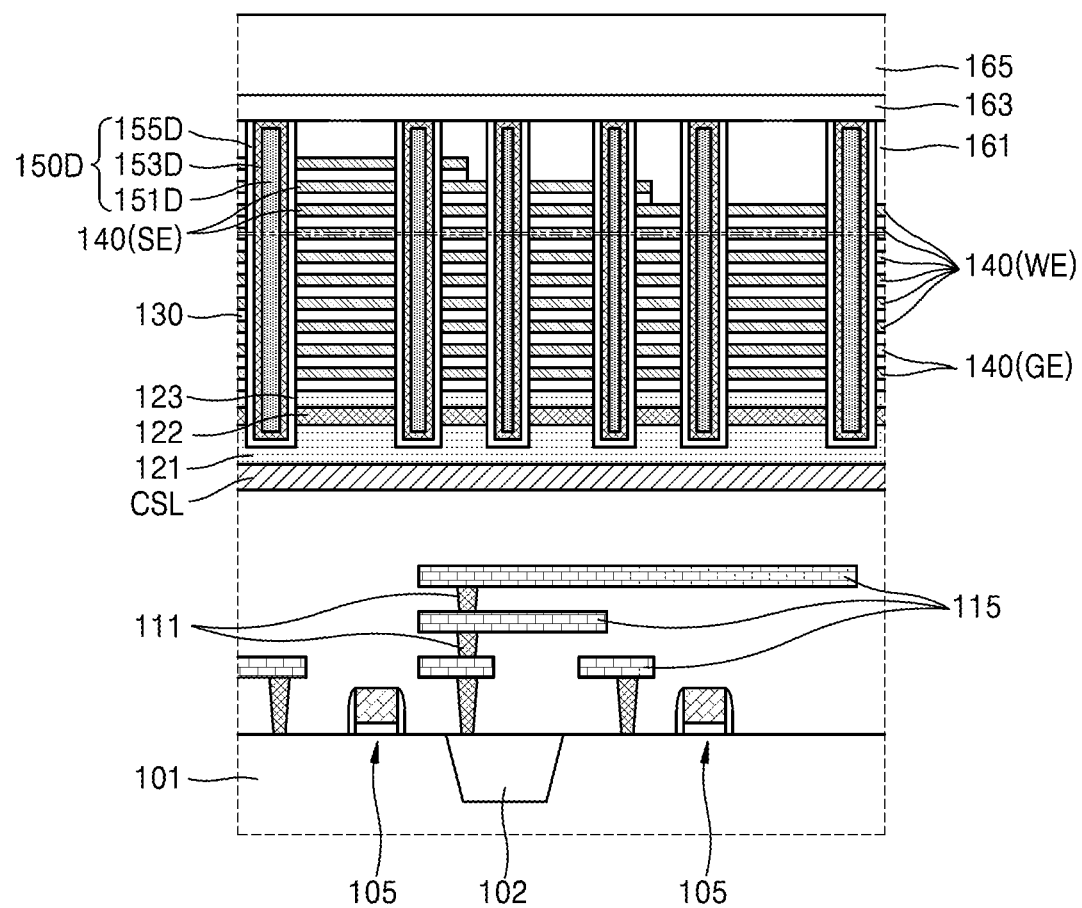

Subsequently, referring to FIGS. 15A and 15B, the third upper insulating layer 165 may be provided.

The third upper insulating layer 165 may be filled in the word line cut WLC and cover an upper surface of the second upper insulating layer 163. The plurality of gate electrodes 140 of the same level horizontally separated by the third upper insulating layer 165 may be insulated from each other.

Figure 16A:
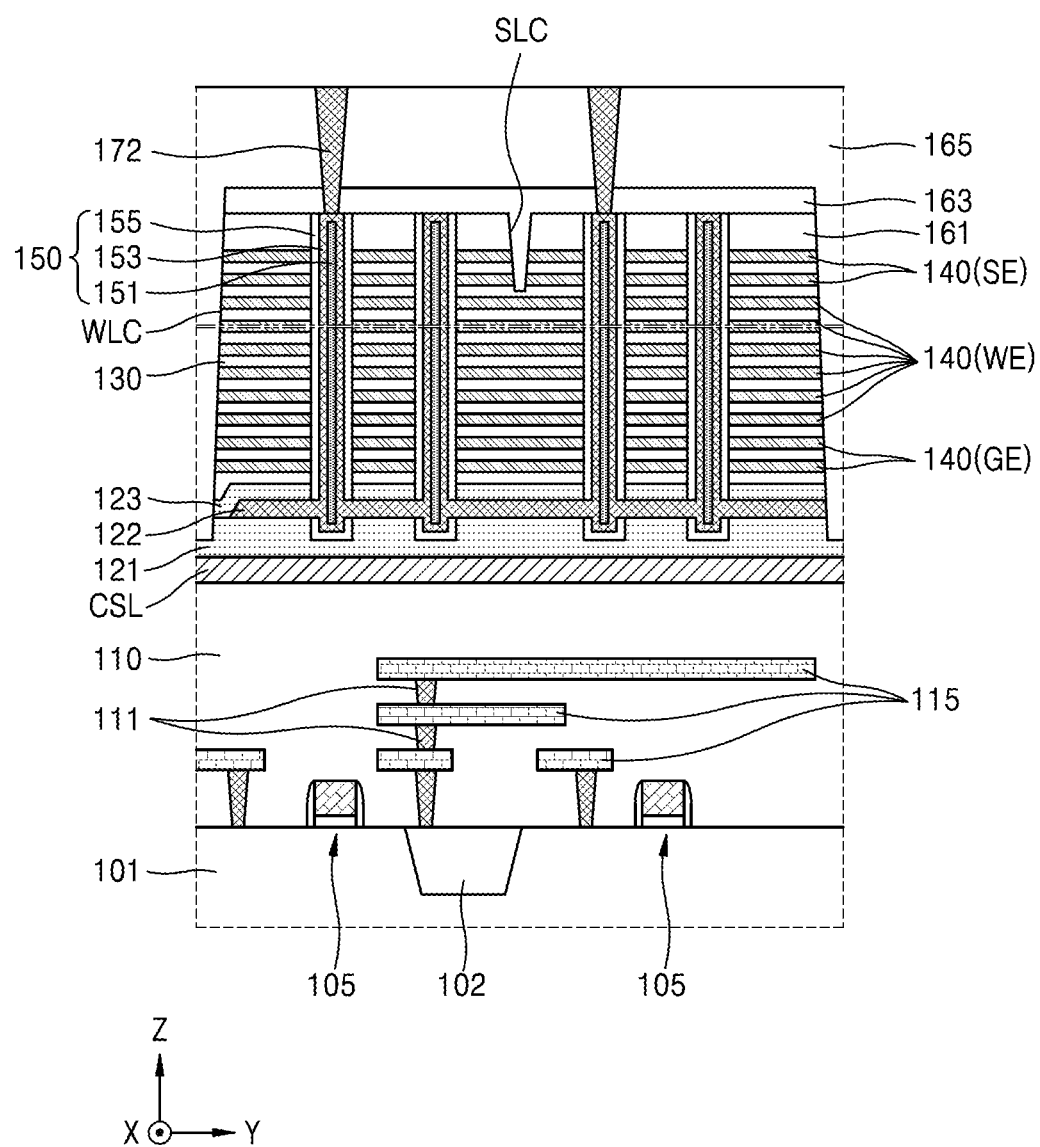
Figure 16B:
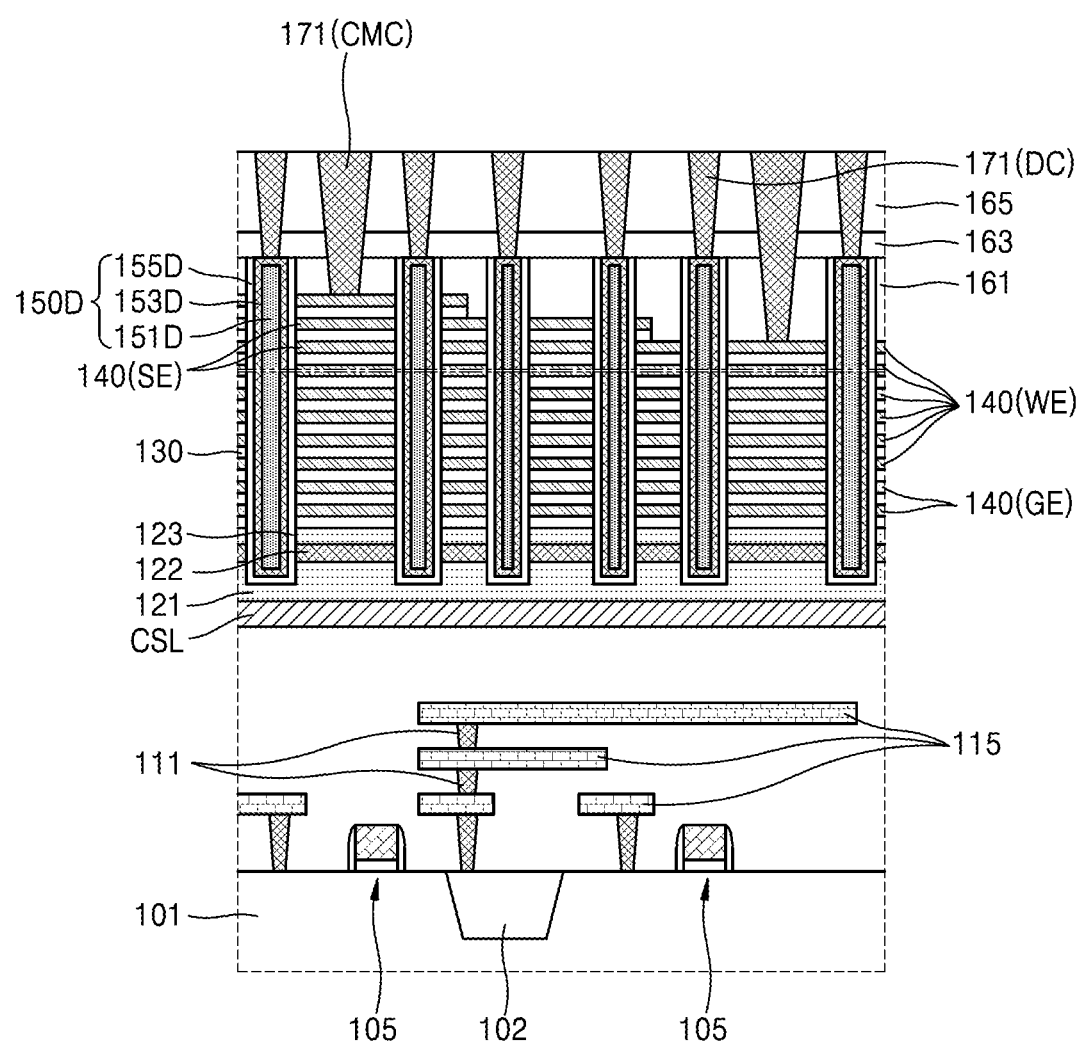

Referring to FIGS. 8, 16A, and 16B, the first contacts 171 may be formed in P150.

The first contacts 171 may include the cell gate contacts 171(CMC) contacting an exposed part of the gate electrode 140 of the contact region CNTR and the dummy contacts 171(DC) contacting the plurality of dummy channel structures 150D of the contact region CNTR.

After forming holes for providing the first contacts 171 and providing a conductive material to be filled in the holes, the first contacts 171 are horizontally separated through a process such as metal chemical mechanical polishing (CMP), and thus the cell gate contacts 171(CMC) and the dummy contacts 171(DC) may be formed.

Before forming the first contacts 171, the bit line contacts 172 contacting the channel structures 150 may be further formed. However, the inventive concept is not limited thereto, and after the first contacts 171 are formed, the bit line contacts 172 may be formed.

In a semiconductor device of the related art, the dummy contacts 171(DC) are not formed on the plurality of dummy channel structures 150D that do not operate as cell strings. Accordingly, in a process of forming the cell gate contacts 171(CMC), the plurality of dummy channel structures 150D operate as floating capacitors. In this case, the plurality of dummy channel structures 150D are charged by positive ions included in an initial etching ion etching process, and thus a voltage bias is applied to change paths of subsequent positive ions. Accordingly, there is a problem in that shapes of the holes for forming the cell gate contacts 171(CMC) and shapes of the cell gate contacts 171(CMC) are distorted.

According to embodiments, holes for forming the dummy contacts 171(DC) may be formed on the plurality of dummy channel structures 150D that do not operate as cell strings. Accordingly, shapes of the holes for forming the cell gate contacts 171(CMC) may be inhibited/prevented from being distorted and the reliability of manufacturing the semiconductor device may be improved.

Next, referring to FIGS. 6A and 6B, the first upper conductive pattern 181, the second contacts 173, and the second upper conductive pattern 183 may be further formed by additionally performing a certain wiring process.

Accordingly, any one of the semiconductor devices 100, 100a, 100b, 100c, 100d, 100e, 100f, and 100g described with reference to FIGS. 5 to 7G may be provided.

While the inventive concept has been particularly shown and described with reference to embodiments thereof, it will be understood that various changes in form and details may be made therein without departing from the scope of the following claims.

What is claimed is:

1. A non-volatile memory device comprising:
   a substrate comprising a cell array region and a contact region;
   a plurality of gate electrodes arranged on the substrate with respect to each other in a first direction perpendicular to an upper surface of the substrate, the plurality of gate electrodes extending in the cell array region and the contact region;
   a plurality of channel structures penetrating the plurality of gate electrodes in the first direction in the cell array region;
   a plurality of dummy channel structures penetrating the plurality of gate electrodes in the first direction in the contact region;
   a plurality of cell gate contacts extending in the first direction and each electrically connected to a respective one of the plurality of gate electrodes in the contact region;
   a plurality of dummy contacts extending in the first direction on the plurality of dummy channel structures;

a plurality of bit lines extending in a second direction parallel to an upper surface of the substrate in the cell array region and vertically overlapping at least some of the plurality of channel structures; and a plurality of word lines each extending in a third direction parallel to the upper surface of the substrate and different from the second direction in the contact region and each connected to a corresponding one of the plurality of cell gate contacts, wherein upper surfaces of the plurality of dummy contacts are coplanar with upper surfaces of the plurality of cell gate contacts, and wherein the plurality of dummy contacts are not vertically overlapped by the plurality of bit lines and are not vertically overlapped by the plurality of word lines.

2. The non-volatile memory device of claim 1, wherein each of the plurality of dummy contacts is in contact with a respective one of the plurality of dummy channel structures.

3. The non-volatile memory device of claim 1, further comprising:
an upper insulating layer covering upper surfaces of the plurality of dummy contacts.

4. The non-volatile memory device of claim 1, wherein each of the plurality of cell gate contacts is between four of the plurality of dummy contacts that are on the respective one of the plurality of gate electrodes.

5. The non-volatile memory device of claim 1, wherein each of the plurality of cell gate contacts is at a center of a square defined by four of the plurality of dummy contacts that are on the respective one of the plurality of gate electrodes.

6. The non-volatile memory device of claim 1, wherein a horizontal cross-section of each of the plurality of dummy contacts is circular.

7. The non-volatile memory device of claim 1, wherein a horizontal cross-section of each of the plurality of dummy channel structures is an ellipse with a major axis parallel to a second direction perpendicular to the first direction.

8. The non-volatile memory device of claim 7, wherein each of the plurality of cell gate contacts is between two of the plurality of dummy contacts that are on the respective one of the plurality of gate electrodes.

9. The non-volatile memory device of claim 7, wherein a horizontal cross-section of each of the plurality of dummy contacts comprises an elliptical shape with a major axis parallel to the second direction.

10. A non-volatile memory device comprising:
a plurality of gate electrodes stacked on a substrate with respect to each other in a first direction perpendicular to the substrate, wherein the plurality of gate electrodes constitute a stairstep structure in which a first of the plurality of gate electrodes protrudes more in a second direction perpendicular to the first direction than a second of the plurality of gate electrodes that is farther away from the substrate;
a plurality of dummy channel structures penetrating the stairstep structure in the first direction;
a plurality of cell gate contacts extending in the first direction on the stairstep structure and each electrically connected to a respective one of the plurality of gate electrodes;
a plurality of dummy contacts each extending in the first direction and electrically connected to a respective one of the plurality of dummy channel structures; and
a plurality of connection patterns between the plurality of dummy contacts and the plurality of dummy channel structures,
wherein each of the plurality of connection patterns is configured to be connected between a dummy contact of the plurality of dummy contacts and a respective at least two of the plurality of dummy channel structures.

11. The non-volatile memory device of claim 10, wherein each of the plurality of dummy contacts is in contact with the respective one of the plurality of dummy channel structures.

12. The non-volatile memory device of claim 10, wherein the plurality of dummy contacts are horizontally spaced apart from the plurality of dummy channel structures.

13. The non-volatile memory device of claim 10, wherein each of the plurality of dummy contacts is between the at least two of the plurality of dummy channel structures.

14. The non-volatile memory device of claim 10, wherein a planar shape of each of the plurality of connection patterns is an H shape.

15. The non-volatile memory device of claim 10, wherein a planar shape of each of the plurality of connection patterns is a square shape.

16. An electronic system comprising:
a main substrate;
a non-volatile memory device on the main substrate; and
a controller electrically connected to the non-volatile memory device on the main substrate, wherein the non-volatile memory device comprises:
a substrate comprising a cell array region and a contact region;
a plurality of gate electrodes arranged on the substrate with respect to each other in a first direction perpendicular to an upper surface of the substrate, the plurality of gate electrodes extending in the cell array region and the contact region;
a plurality of channel structures penetrating the plurality of gate electrodes in the first direction in the cell array region;
a plurality of dummy channel structures penetrating the plurality of gate electrodes in the first direction in the contact region;
a plurality of cell gate contacts extending in the first direction and each connected to a respective one of the plurality of gate electrodes in the contact region;
a plurality of dummy contacts extending in the first direction on the plurality of dummy channel structures;
a plurality of bit lines extending in a second direction parallel to an upper surface of the substrate in the cell array region and vertically overlapping at least some of the plurality of channel structures; and
a plurality of word lines each extending in a third direction parallel to the upper surface of the substrate and different from the second direction in the contact region and each connected to a corresponding one of the plurality of cell gate contacts,
wherein the plurality of dummy contacts are not vertically overlapped by the plurality of bit lines and are not vertically overlapped by the plurality of word lines.

17. The electronic system of claim 16,
wherein the main substrate further comprises wiring patterns configured to electrically connect the non-volatile memory device to the controller,
wherein the non-volatile memory device further comprises an upper insulating layer covering upper surfaces of the plurality of dummy contacts, and
wherein each of the plurality of dummy contacts is in contact a respective one of the plurality of dummy channel structures.

* * * * *